US008450690B2

(12) United States Patent
Averitt et al.

(10) Patent No.: US 8,450,690 B2
(45) Date of Patent: May 28, 2013

(54) THERMAL IMAGER USING METAMATERIALS

(75) Inventors: Richard Averitt, Newton, MA (US); Xin Zhang, Medford, MA (US); Hu Tao, Medford, MA (US); Andrew Strikwerda, Jamaica Plain, MA (US); Willie J. Padilla, Newton, MA (US); Eric Shaner, Albuquerque, NM (US)

(73) Assignees: Trustees of Boston University, Boston, MA (US); Trustees of Boston College, Chestnut Hill, MA (US)

( * ) Notice: Subject to any disclaimer, the term of this patent is extended or adjusted under 35 U.S.C. 154(b) by 0 days.

(21) Appl. No.: 13/252,821

(22) Filed: Oct. 4, 2011

(65) Prior Publication Data

US 2012/0261575 A1    Oct. 18, 2012

Related U.S. Application Data

(60) Provisional application No. 61/389,625, filed on Oct. 4, 2010.

(51) Int. Cl.
*G01J 5/02* (2006.01)

(52) U.S. Cl.
USPC ..................................... 250/341.1

(58) Field of Classification Search
USPC ................. 250/341.1, 341.6, 341.8
See application file for complete search history.

(56) References Cited

U.S. PATENT DOCUMENTS

| 7,205,941 | B2* | 4/2007 | Wang et al. ............ 343/700 MS |
| 7,535,003 | B2 | 5/2009 | Honda et al. ............... 250/338.4 |
| 7,580,175 | B2 | 8/2009 | Aksyuk et al. ............. 359/290 |
| 7,705,307 | B1 | 4/2010 | Zhao et al. ............. 250/338.1 |
| 7,705,309 | B1 | 4/2010 | Jin et al. ................ 250/338.1 |
| 7,826,504 | B2 | 11/2010 | Chen et al. ............. 372/43.01 |
| 7,851,759 | B2 | 12/2010 | Aksyuk et al. ........... 250/338.1 |
| 2006/0284774 | A1 | 12/2006 | Salsman ................. 343/703 |
| 2008/0188064 | A1 | 8/2008 | Samuelson et al. ......... 438/488 |
| 2009/0009853 | A1* | 1/2009 | Tonucci .................. 359/298 |
| 2010/0025581 | A1 | 2/2010 | Aksyuk et al. ............. 250/332 |
| 2012/0241616 | A1* | 9/2012 | Axelrod et al. ........... 250/336.1 |

OTHER PUBLICATIONS

Asada, Masahiro, "Proposal and Analysis of a Semiconductor Klystron Device Using Two-Dimensional Electron Gas for Terahertz Amplification and Oscillation", *Japanese Journal of Applied Physics* vol. 43, No. 9A (2004) 5967-5972.

(Continued)

*Primary Examiner* — Mark R Gaworecki
(74) *Attorney, Agent, or Firm* — Sunstein Kann Murphy & Timbers LLP

(57) ABSTRACT

An apparatus and method are disclosed for detecting terahertz radiation at room temperature. A detecting pixel includes a sub-wavelength split-ring resonator, and is mechanically coupled to (but thermally decoupled from) a substrate via a cantilever formed from two materials that have a significant mismatch in their thermal expansion coefficients. Incident radiation causes the split-ring resonator to resonate, thereby generating heat that is transferred to the cantilever, causing the cantilever to flex. An optical readout system includes a secondary light source, such as a laser, that shines on a reflective surface on the pixel, whereby a photodiode detects the reflected light and permits calculation of a relative deflection of the pixel in the nanometer range. An exemplary detector has a noise equivalent power rating of approximately 60 pW/√Hz.

19 Claims, 18 Drawing Sheets

OTHER PUBLICATIONS

Asada, Masahiro, "Proposal and Analysis of a Traveling-Wave Amplifier in Terahertz Range Using Two-Dimensional Electron Gas", *Japanese Journal of Applied Physics* vol. 43, No. 4A (2004) 1332-1333.

Barber, Jeffrey et al., "Temperature-Dependent Far-Infrared Spectra of Single Crystals of High Explosives Using Terahertz Time-Domain Spectroscopy", *J. Phys. Chem. A* 2005, 109, 3501-3505.

Beere, H.E. et al., "MBE growth of terahertz quantum cascade lasers", *Journal of Crystal Growth* 278 (2005) 756-764.

Belkin, Mikhail et al., "Terahertz quantum-cascade-laser source based on intracavity difference-frequency generation", *Nature Photonics* vol. 1 (May 2007) 288-292.

Chen, Hou-Tong et al., "Active terahertz metamaterial devices", *Nature* vol. 444 (Nov. 30, 2006), 597-600.

Chen, Hou-Tong et al., "Identification of a Resonant Imaging Process in Apertureless Near-Field Microscopy", *Phys. Rev. L.* 93, 267401 (2004).

Chen, Hou-Tong et al., "Ultrafast optical switching of terahertz metamaterials fabricated on ErAs/GaAs nanoisland superlattices", *Optics Letters* vol. 322, No. 12 (Jun. 15, 2007) 1620-1622.

Cho, Gyu Cheon et al., "Apertureless terahertz near-field microscopy", *Semicond. Sci. Technol.* 20 (2005) S286-S292.

Fan, W.H. et al., "Far-Infrared Spectroscopic Characterization of Explosives for Security Applications Using Broadband Terahertz Time-Domain Spectroscopy", *Applied Spectroscopy* vol. 61, No. 6 (2007) 638-643.

Fasching, G. et al., "Terahertz microcavity quantum-cascade lasers", *Appl. Phys. L.* 87, 211112 (2005).

Federici, John et al., "Standoff Sensing of Explosives Using Terahertz Radiation", *American Laboratory* vol. 38 (Jun.-Jul. 2006) 28-33.

Federici, John et al., "Terahertz near-field imaging", *Phys. Med. Biol.* 47 (2002) 3727-3734.

Foltynowicz, Robert J. et al., "Terahertz absorption measurement for gas-phase 2,4-dinitrotoluene from 0.05 THz to 2.7 THz", *Chem. Phys. L.* 431 (2006) 34-38.

Goldhirsh, Julius, "Attenuation and Backscatter From a Derived Two-Dimensional Duststorm Model", *IEEE Trans. On Antennas and Propagation* vol. 49, No. 12 (Dec. 2001) 1703-1711.

Hajenius, M. et al., "Full characterization and analysis of a terahertz heterodyne receiver based on a NbN hot electron bolometer", *J. Appl. Phys.* 100, 074507 (2006).

Hu, Ying et al., "Terahertz spectroscopic investigations of explosives", *Phys. Rev. L. A* 359 (2006) 728-732.

Ishihara, Kunihiko et al., "Terahertz-wave near-field imaging with subwavelength resolution using surface-wave-assisted bow-tie aperture", *Appl. Phys. L.* 39, 201120 (2006).

Kabir, N. A. et al., "Terahertz transmission characteristics of high-mobility GaAs and InAs two-dimensional-electron-gas systems", *Appl. Phys. L.* 39, 132109 (2006).

Krafft, G.A., "Compact high-power terahertz radiation source", *Phys. Rev. Special Topics—Accelerators and Beams* vol. 7, 060704 (2004).

Kroug, M. et al., "NbN Hot Electron Bolometric Mixers for Terahertz Receivers", *IEEE Trans. On Appl. Superconductivity*, vol. 11, No. 1 (Mar. 2001) 962-965.

Li, Biao, "Design and simulation of an uncooled double-cantilever microbolometer with the potential for ~mK NETD", *Sensors and Actuators A* 112 (2004) 351-359.

Liu, Hai-Bo et al., "Detection and identification of explosive RDX by THz diffuse reflection spectroscopy", *Optics Express*, vol. 14, No. 1 (Jan. 9, 2006) 415-423.

Makul'kin, A. V., "Possible Source of Terahertz Coherent Synchrotron Radiation Based on an Ultraminiature Synchrotron", *Atomic Energy*, vol. 101, No. 5 (2006) 846-852.

Mayorga, I. Cámara et al., "Terahertz photonic mixers as local oscillators for hot electron bolometer and superconductor-insulator-superconductor astronomical receivers", *J. Appl. Phys.* 100, 043116 (2006).

Mittleman, D. M. et al., "Recent advances in terahertz imaging", *Appl. Phys. B* 68 (1999) 1085-1094.

Overton, Gail, "Terahertz technology: Tunable compact terahertz source is powerful, efficient", *Laser Focus World*, vol. 42 (Apr. 2006) pp. 17-18.

Padilla, W. J. et al., "Dynamical Electric and Magnetic Metamaterial Response at Terahertz Frequencies", *Phys. Rev. L.* 96, 107401 (2006).

Peytavit, E. et al., "Integrated terahertz TEM horn antenna", *Electronics Letters* vol. 43 No. 2 (Jan. 18, 2007) 73-75.

Richter, M. et al., "Model of thermal terahertz light emission from a two-dimensional electron gas", *Phys. Rev. L. B* 75, 115331 (2007).

Saeedkia, Daryoosh et al., "A Submilliwatt Terahertz High-Temperature Superconductive Photomixer Array Source: Analysis and Design", *IEEE Trans. on Appl. Superconductivity*, vol. 15, No. 3 (Sep. 2005) 3868-3873.

Semenov, A.D. et al., "Superconducting noise bolometer for terahertz radiation", *Appl. Phys. L.* 87, 173508 (2005).

Shen, Y. C. et al., "Detection and identification of explosives using terahertz pulsed spectroscopic imaging", *Appl. Phys. L.* 86, 241116 (2005).

Tredicucci, A. et al., "Terahertz quantum cascade lasers", *Physica E* 21 (2004) 846-851.

Tredicucci, A. et al., "Terahertz quantum cascade lasers—first demonstration and novel concepts", *Semicon. Sci. Technol.* 20 (2005) S222-S227.

Wilcox, K. G. et al., "Terahertz imaging system based on LT-GaAsSb antenna driven by all-semiconductor femtosecond source", *Electronics Letters*, vol. 42, No. 20 (Sep. 28, 2006) 1159-1161.

Williams, B. S. et al., "High-power terahertz quantum-cascade lasers", *Electronics Letters*, vol. 42, No. 2 (Jan. 19, 2006) 8991.

Xu, W., "Dynamical Properties of a Terahertz Driven Two-dimensional Electron Gas", *Aust. J. Phys.* 53 (2000) 87-105.

Yngvesson, K. S., "Ultrafast two-dimensional electron gas detector and mixer for terahertz radiation", *Appl. Phys. L.* 76, No. 6 (Feb. 7, 2000) 777-779.

Zandonella, Catherine, "Terahertz imaging: T-ray specs", *Nature* vol. 424 (Aug. 14, 2003) 721-722.

Zhang, Zhengwei et al., "Terahertz time-domain spectroscopy for explosive imaging", *Optik* 118 (2007) 325-329.

Zhao, Yang et al., "Optomechanical Uncooled Infrared Imaging System: Design, Microfabrication, and Performance", *J. Microelectromechanical Sys.*, vol. 11, No. 2 (Apr. 2002) 136-146.

* cited by examiner

|  | a | b | c | d | e | f | g | h | i | w |
|---|---|---|---|---|---|---|---|---|---|---|
| 95 GHz | 435 | 415 | 395 | 10 | 50 | 50 | 10 | — | — | 10 |
| 690 GHz | 80 | 67 | 49 | 5 | 13 | 26 | 2.5 | 16 | 51 | 5 |

THERMAL IMAGER USING METAMATERIALS

CROSS-REFERENCE TO RELATED APPLICATION

This application claims the benefit of U.S. Provisional Application No. 61/389,625, filed Oct. 4, 2010, the contents of which are incorporated herein by reference in their entirety.

STATEMENT REGARDING FEDERALLY SPONSORED RESEARCH OR DEVELOPMENT

This invention was made with Government support under Contract No. HR0011-08-1-0044 awarded by the Defense Advanced Research Projects Agency, and Contract No. ECCS-0802036 awarded by the National Science Foundation. The Government has certain rights in the invention.

TECHNICAL FIELD

The present invention relates to an infrared and microwave detector array, and more particularly to a terahertz (THz) detector array having a plurality of independently responsive detectors (pixels).

BACKGROUND ART

The terahertz (THz) region of the electromagnetic spectrum extends from 100 GHz to 10 THz (where 1 THz corresponds to a wavelength of 300 microns and photon energy of 4.1 meV). This region, alternatively called the far-infrared, lies below visible and infrared wavelengths and above microwave wavelengths. From RF waves through X-rays, this narrow portion of the electromagnetic spectrum is the least developed and therefore the least understood scientifically and technologically. Recently, however, there have been important advances using electronic and optical techniques to generate and detect THz radiation. See, for example, D. Mittleman, "Sensing with Terahertz Radiation" (Springer-Verlag, 2003) and K. Sakai, "Terahertz Optoelectronics" (Springer-Verlag, 2005).

What technological benefits are to be derived from advancing our ability to generate and detect THz radiation? It is the ability of terahertz radiation to "see" through materials that are opaque at other frequencies that has caused the most excitement for safety, security, and non-invasive diagnostic applications. For example, FIG. 1 shows terahertz transmission as a function of frequency through typical packaging materials. The transmission of cardboard and Styrofoam at THz frequencies is substantial whereas at infrared and optical frequencies these materials are opaque. These materials would also be transparent to X-rays but THz radiation has the advantage of being non-ionizing. Microwaves would also be easily transmitted through these materials, but THz has additional advantages in several important respects. For imaging applications, the shorter wavelength of THz radiation in comparison to microwaves leads to a higher spatial resolution (sub-millimeter for THz in comparison to cm for microwave).

Furthermore, THz radiation offers the possibility of spectroscopic materials identification. For example, FIG. 2 shows the THz spectrum of a single crystal of the energetic material RDX and the rotational spectrum of $N_2O$ gas. For RDX, distinct intermolecular vibrational modes are observed. In combination with the aforementioned ability to "see" through materials which are opaque at other frequencies, THz radiation has the potential to image and spectroscopically identify embedded materials or identify defects in materials. See J. Barber et al., "Temperature-dependent far-infrared spectra of single crystals of high explosives using terahertz time-domain spectroscopy," Journal of Physical Chemistry A, vol. 109, pp. 3501-3505, Apr. 21, 2005.

However, it is important to emphasize that the examples depicted in FIGS. 1 and 2 were performed in a laboratory environment using the technique of terahertz time-domain spectroscopy (THz-TDS). While THz-TDS is one of the most powerful experimental techniques to investigate terahertz science and technology and the associated potential applications, it is not ideal for many real-world applications primarily because of the low-average power and interferometric-like gated detection which necessitates precision alignment.

More generally, the realization of potential THz applications requires advances in source, component (e.g. lenses, filters, modulators, isolators, etc.), and detector technologies. Indeed, there is an active world-wide effort in each of these areas. One area of research is terahertz quantum cascade lasers; see, for example, B. S. Williams et al., "High-power terahertz quantum-cascade lasers," Electronics Letters, vol. 42, pp. 89-91, Jan. 19, 2006; G. Fasching et al., "Terahertz microcavity quantum-cascade lasers," Applied Physics Letters, vol. 87, Nov. 21, 2005; A. Tredicucci et al., "Terahertz quantum cascade lasers: first demonstration and novel concepts," Semiconductor Science and Technology, vol. 20, pp. S222-S227, July 2005; H. E. Beere et al., "MBE growth of terahertz quantum cascade lasers," Journal of Crystal Growth, vol. 278, pp. 756-764, May 1, 2005; and A. Tredicucci et al., "Terahertz quantum cascade lasers," Physica E: Low-Dimensional Systems & Nanostructures, vol. 21, pp. 846-851, March 2004.

Another area of active research is low cost compact detectors such as two-dimensional electron gas plasmon detectors; see, for example, M. Asada, "Proposal and analysis of a semiconductor klystron device using two-dimensional electron gas for terahertz amplification and oscillation," Japanese Journal of Applied Physics Part 1-Regular Papers Short Notes & Review Papers, vol. 43, pp. 5967-5972, September 2004; M. Asada, "Proposal and analysis of a traveling-wave amplifier in terahertz range using two-dimensional electron gas," Japanese Journal of Applied Physics Part 1-Regular Papers Short Notes & Review Papers, vol. 43, pp. 1332-1333, April 2004; N. A. Kabir et al., "Terahertz transmission characteristics of high-mobility GaAs and InAs two-dimensional-electron-gas systems," Applied Physics Letters, vol. 89, Sep. 25, 2006; M. Richter et al., "Model of thermal terahertz light emission from a two-dimensional electron gas," Physical Review B, vol. 75, March 2007; W. Xu, "Dynamical properties of a terahertz driven two-dimensional electron gas," Australian Journal of Physics, vol. 53, pp. 87-105, 2000; and K. S. Yngvesson, "Ultrafast two-dimensional electron gas detector and mixer for terahertz radiation," Applied Physics Letters, vol. 76, pp. 777-779, Feb. 7, 2000.

Our recent work has focused on the development of THz components where our approach has focused on using metamaterials. See H. T. Chen et al., "Identification of a resonant imaging process in apertureless near-field microscopy," Phys. Rev. Lett., vol. 93, pp. 267401-267404, 2004 and W. J. Padilla et al., "Dynamical electric and magnetic metamaterial response at terahertz frequencies," Physical Review Letters, vol. 96, pp. 107401/1-4, 2006. Metamaterials (MM) are sub-wavelength composites where the electromagnetic response originates from oscillating electrons in highly conducting metals such as gold or copper, allowing for a design specific resonant response of the electrical permittivity or magnetic permeability. This design flexibility allows for realization of phenomena not available with natural materials.

FIG. 3(a) shows a portion of a planar metamaterial array consisting of 200 nm thick Au split ring resonators (SRRs) fabricated on a GaAs substrate. The individual SRR elements are 36×36 μm, 4 μm line width, 2 μm gap, with a lattice spacing of 50 μm. The underlying principle for creating dynamic or active metamaterials is that the SRR elements behave as a resonant LC circuit (see FIG. 3(b))—the solenoidal structure provides the inductance L and the capacitance C is obtained from the split gap. The array shown in FIG. 3a is designed to be strongly resonant at far-infrared (terahertz) frequencies.

The top portion of FIG. 4 shows the experimentally measured transmission versus frequency for a planar array of Cu split ring resonators fabricated on GaAs. The red curve is the transmission in the unperturbed sample. The resonance labeled $\omega_0$ is due to circulating currents while the $\omega_1$ resonance is due to an in-phase dipolar response of the carriers. Photoexcitation of carriers in GaAs "short-circuits" the resonant response thereby acting as a switch. The lower portion of FIG. 4 shows electromagnetic simulations of the surface current density confirming this interpretation. Thus, this simple SRR array is an effective notch filter for THz radiation. This array of SRRs can also function as narrowband switch to modulate incident terahertz radiation through dynamic modification of the capacitance. For example, photoexcitation of electrons in the GaAs substrate will shunt the SRR capacitance (see FIG. 3(b)) thereby turning off the resonant response. As FIG. 4 reveals, an incident power of 0.5 mW results in a enhanced transmission and for a power of 1.0 mW (black curve—corresponding a substrate carrier density of $2 \times 10^{16}$ cm$^{-3}$) the resonant response almost entirely vanishes. This result constitutes an optically controlled terahertz switch/modulator and has recently been extended to ultrafast operation (~10 ps on/off times) using nanostructured substrates having ultrafast carrier recombination times; see H. T. Chen et al., "Ultrafast optical switching of terahertz metamaterials fabricated on ErAs/GaAs Nanoisland Superlattices," Opt. Lett., vol. 32, pp. 1620-1622, 2007. We have also demonstrated voltage control of the metamaterial response; see H. T. Chen et al., "Active terahertz metamaterial devices," Nature, vol. 44, pp. 597-600, 2006. The advances in creating functional THz components derive from the ability to design resonant sub-wavelength metamaterial elements.

SUMMARY OF VARIOUS EMBODIMENTS

We have developed a low-cost, easily fabricated, optomechanical, uncooled, metamaterial-enhanced, terahertz radiation detector with an operation frequency, in some example embodiments, of approximately 650 GHz for active imaging applications. We have extended the utility of MM to create a new, thermal-based THz radiation detector with a Noise Equivalent Power (NEP) of about 60 pW/Hz$^{1/2}$ (the potential theoretical NEP can reach under 10 pW/Hz$^{1/2}$), or about 0.2 mK/Hz$^{1/2}$ in term of Noise Equivalent Temperature Difference (NETD). We accomplished this goal by combining resonant MM with MEMS bi-material cantilever technology to create sub-wavelength pixels that operate at room temperature, have optical readout, and can be fabricated into focal plane arrays for active imaging applications.

In a first embodiment of the invention, there is provided an apparatus for detecting terahertz radiation at room temperature. The apparatus includes a substrate and a detection structure. The detection structure include (a) an optically reflective surface, and (b) a radiation absorption pad having formed thereon a split-ring resonator. The SRR has a characteristic dimension and an electrical resonance frequency that corresponds to a wavelength of the terahertz radiation that is greater than the characteristic dimension. The detection structure is coupled to the substrate by a flexible cantilever having two types of folded legs. First, the cantilever has a plurality of actuation legs that flex when heated, and are formed from two materials having substantially different coefficients of thermal expansion. Second, the cantilever has a plurality of thermal isolation legs having substantially lower thermal conductivity than the actuation legs.

The substrate may be a silicon (Si) wafer or a gallium arsenide (GaAs) wafer. The detection structure may be a silicon nitride (SiN$_x$) thin film. The optically reflective surface may be formed from gold (Au). The plurality of actuation legs may be formed from layers of silicon nitride (SiN$_x$) and gold (Au). The plurality of thermal isolation legs may be formed from silicon nitride (SiN$_x$). The wavelength of the terahertz radiation detected may be between 30 μm and 3000 μm. The characteristic dimension of the split-ring resonator is between 5 μm and 500 μm. The radiation absorption pad may have formed thereon a plurality of split-ring resonators.

In a second embodiment of the invention, there is provided a method of imaging an object. The method includes illuminating the object with terahertz radiation having a wavelength and absorbing, in a detector, a portion of the terahertz radiation that has interacted with the object. The detector includes a plurality of pixels that move when heated, each pixel having formed thereon a split-ring resonator. At least one of the split-ring resonators has a characteristic dimension that is less than the wavelength of the terahertz radiation and an electrical resonance frequency that corresponds to the wavelength of the terahertz radiation. Absorption of the portion of radiation causes the at least one split-ring resonator to generate sufficient heat to cause movement of the pixel on which it is formed.

The wavelength of the terahertz radiation detected may be between 30 μm and 3000 μm. The characteristic dimension of the split-ring resonator is between 5 μm and 500 μm. The detector may also include a fixed substrate, wherein each pixel in the plurality of pixels is attached to the substrate by a cantilever that flexes when conductively heated. In this embodiment, each cantilever may include (a) a plurality of actuation legs formed from two materials having substantially different coefficients of thermal expansion, and (b) a plurality of thermal isolation legs having substantially lower thermal conductivity than the actuation legs. A given pixel may have formed thereon a plurality of split-ring resonators, so that absorption of the portion of radiation causes the plurality of split-ring resonators to generate sufficient heat to cause movement of the given pixel.

The method may be extended by illuminating the detector pixels with a secondary light source and measuring light, from the secondary light source, that is reflected from the surface of a pixel to determine a relative deflection of the pixel. The secondary light source may be a laser, such as a He—Ne laser. Each pixel may absorb a different portion of the terahertz radiation that interacted with the object, thereby causing non-uniform deflection of the pixels. In this case, one may produce a raster image having pixel data, each pixel datum being a function of the relative deflection of a corresponding detector pixel.

BRIEF DESCRIPTION OF THE DRAWINGS

The foregoing features of embodiments will be more readily understood by reference to the following detailed description, taken with reference to the accompanying drawings, in which:

FIG. 7b shows the absorption calculated as a function of the transmission and reflection shown in FIG. 7a;

FIG. 11b shows surface profiles of the reflector vs. temperature changes for the simulation of FIG. 11a;

DETAILED DESCRIPTION OF SPECIFIC EMBODIMENTS

We have developed a low-cost, easily fabricated, optomechanical, uncooled, metamaterial-enhanced, terahertz radiation detector with an operation frequency, in some example embodiments, of 650 GHz for active imaging applications. We have extended the utility of MM to create a new, thermal-based THz radiation detector with a Noise Equivalent Power (NEP) of about 60 $pW/Hz^{1/2}$ (the potential theoretical NEP can reach under 10 $pW/Hz^{1/2}$), or about 0.2 $mK/Hz^{1/2}$ in term of Noise Equivalent Temperature Difference (NETD). We accomplished this goal by combining resonant MM with MEMS bi-material cantilever technology to create sub-wavelength pixels that operate at room temperature, have optical readout, and can be fabricated into focal plane arrays for active imaging applications.

Definitions. As used in this description and the accompanying claims, the following terms shall have the meanings indicated, unless the context otherwise requires:

"Terahertz radiation" shall mean radiation having a frequency between 100 GHz and 10 THz, corresponding to wavelengths between 30 microns (µm) and 3000 microns.

A "metamaterial" is a material formed from electromagnetically resonant structures having a characteristic physical size that is less than the wavelength associated with their resonance frequency. Such structures are referred to as being "sub-wavelength." For example, a metamaterial might be made from 50 micron structures that each have a resonant frequency of 1 THz (corresponding to a wavelength of 300 microns). A sub-wavelength structure may have a characteristic dimension, for example, between one tenth and one fifth of the wavelength corresponding to its resonance frequency.

Figure 18B:
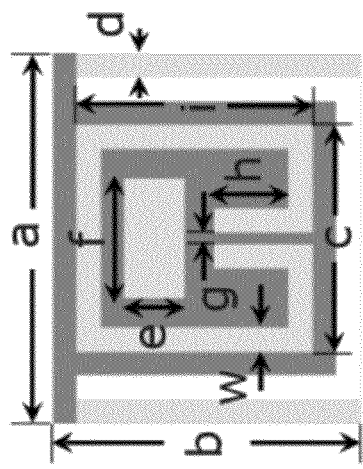
FIG. 18b shows a SRR, in accordance with an embodiment of the invention, that is capable of detecting terahertz radiation having frequencies about 690 GHz.
Figure 18A:
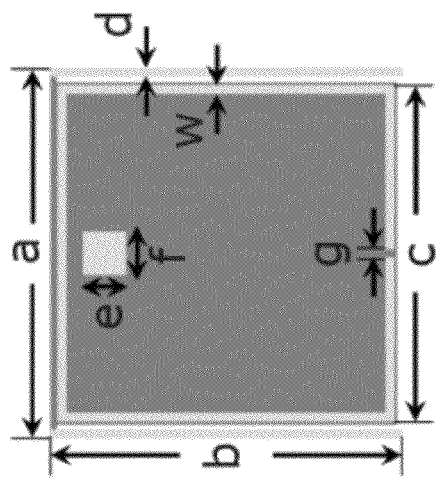
FIG. 18a shows a SRR, in accordance with an embodiment of the invention, that is capable of detecting terahertz radiation having frequencies about 95 GHz.

A "split-ring resonator" or SRR is an electrical structure having the approximate shape of a square or rectangular ring with a gap. An SRR has an electrical resonance based on an inductance (as a function of the ring shape) and a capacitance (as a function of the gap in the ring). An SRR may not be precisely in the shape of a ring; see, for example, the SRR shown in FIG. 6 or FIG. 18a. Exemplary split-ring resonators have a characteristic dimension between 5 µm and 500 µm, and thus may be used in sub-wavelength metamaterials.

Motivation

An important consideration with regard to developing a terahertz detector is the application space and the technical requirements this necessitates. The THz detectors described herein are primarily directed to safety applications using active illumination. For the following reasons, this application necessitates low cost, simple fabrication resulting in a compact detector that operates at room temperature and can be easily incorporated into a focal plane geometry.

Although a cooled photonic terahertz detector provides more sensitive detection, the heavy, expensive cooling system prohibits broad implementation for civilian purposes and further, complicates the development of focal plane geometries. An uncooled detector, on the other hand, provides a much cheaper and lighter solution, with sufficient sensitivity for applications using active illumination. See E. Peytavit et al., "Integrated terahertz TEM horn antenna," Electronics Letters, vol. 43, pp. 73-75, Jan. 18, 2007; M. Hajenius et al., "Full characterization and analysis of a terahertz heterodyne receiver based on a NbN hot electron bolometer," Journal of Applied Physics, vol. 100, Oct. 1, 2006; M. Kroug et al., "NbN hot electron bolometric mixers for terahertz receivers," IEEE Transactions on Applied Superconductivity, vol. 11, pp. 962-965, March 2001; and A. D. Semenov et al., "Superconducting noise bolometer for terahertz radiation," Applied Physics Letters, vol. 87, Oct. 24, 2005.

Imaging detection techniques rely on the contrast between warmer and colder objects or on the contrast between objects that have high and low emissivity of radiation or, equivalently, low and high reflectivity of radiation. Imaging technologies can be either passive or active. There are debates in the research community about the relative quality of images from a passive versus an active imaging system. Active systems have an advantage in that the illumination of objects or individuals with sufficient power results is a higher incident flux on the detector, whereas a passive system must rely on ambient thermal radiation, which is of much lower intensity therefore increasing the sensitivity requirement of the detection system detectors.

Health issues associated with active illumination with THz radiation for imaging are minimal. Terahertz radiation can pass through many clothing materials, but is non-ionizing and therefore harmless to humans at the powers required to achieve high-quality images. Therefore, the potential health effects of this radiation are significantly lower than those using sources of ionizing radiation such as X-rays. See D. M. Mittleman et al., "Recent advances in terahertz imaging," Applied Physics B-Lasers and Optics, vol. 68, pp. 1085-1094, June 1999 and K. G. Wilcox et al., "Terahertz imaging system based on LT-GaAsSb antenna driven by all-semiconductor femtosecond source," Electronics Letters, vol. 42, pp. 1159-1161, Sep. 28, 2006.

Similar to infrared detectors, there are several ways to readout the signal. This includes, for example, the development of resistive bolometers with NEP~75 pW/Hz$^{1/2}$ [25]. However, for an uncooled detector with electrical readout, the electrical interconnects from each element to the highly thermally conductive substrate increases the complexity of the fabrication, and reduces the temperature rise of the detector thereby decreasing the overall sensitivity. See Y. Zhao et al., "Optomechanical uncooled infrared imaging system: Design, microfabrication, and performance," Journal of Microelectromechanical Systems, vol. 11, pp. 136-146, April 2002. Optical readout, on the other hand, is a non-contact detection technique. Hence, the absence of interconnects simplifies the fabrication process, improves the thermal isolation of the sensor, and does not rely on measuring electrical signals generated directly on the detector.

Another issue regarding the development of active terahertz detectors is the appropriate operation frequency, which depends on many aspects including the requirement of resolution, the specific spectrum of targets, the working distance and field-of-view, and available terahertz sources. After comprehensive considerations, we chose 0.65 THz as the working frequency, for the following reasons.

Reasonable atmospheric transmission. The atmosphere attenuates millimeter-wave radiation at frequencies determined by molecular absorption such as water vapor, oxygen, and other atmospheric molecules. In the sub-millimeter region there are atmospheric "windows" at 340, 410, 650, and 850 GHz. For stand-off imaging applications, say concealed weapon detections at 10~50 m away, the optimum frequency is about 600 GHz. Therefore, we choose 650 GHz as the design frequency as this will allow for moderate standoff distances (e.g. ~10 meters at 70% relative humidity). See J. Goldhirsh, "Attenuation and backscatter from a derived two-dimensional duststorm model," IEEE Transactions on Antennas and Propagation, vol. 49, pp. 1703-1711, December 2001.

Figure 1:
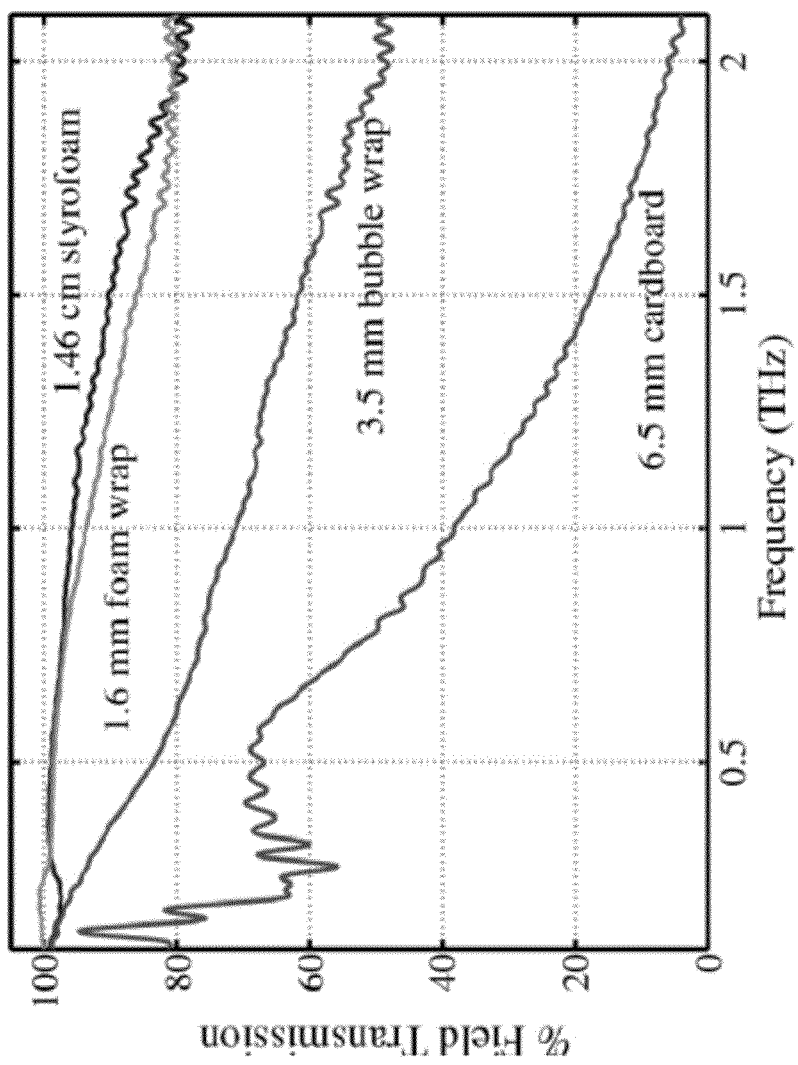
FIG. 1 is a graph showing measured terahertz transmission through typical packaging materials.

Relatively high transmission through typical packaging materials. The utility of terahertz systems lies primarily in their ability to penetrate materials that might shield concealed weapon or explosives from detection. See FIG. 1 and J. Federici et al., "Standoff sensing of explosives using terahertz radiation," American Laboratory, vol. 38, June-July 2006. Typically these materials may be normal clothing, but they could also include luggage. Several groups have characterized numerous articles of clothing and other packaging materials. These sets of measurements indicate the transmission through clothing is generally better than 80% at frequencies below 400 GHz but decreases as the frequency of operation increases, and reaches close to 50% at 650 GHz, which is acceptable for many applications. See I. C. Mayorga et al., "Terahertz photonic mixers as local oscillators for hot electron bolometer and superconductor-insulator-superconductor astronomical receivers," Journal of Applied Physics, vol. 100, Aug. 15, 2006.

Figure 2B:
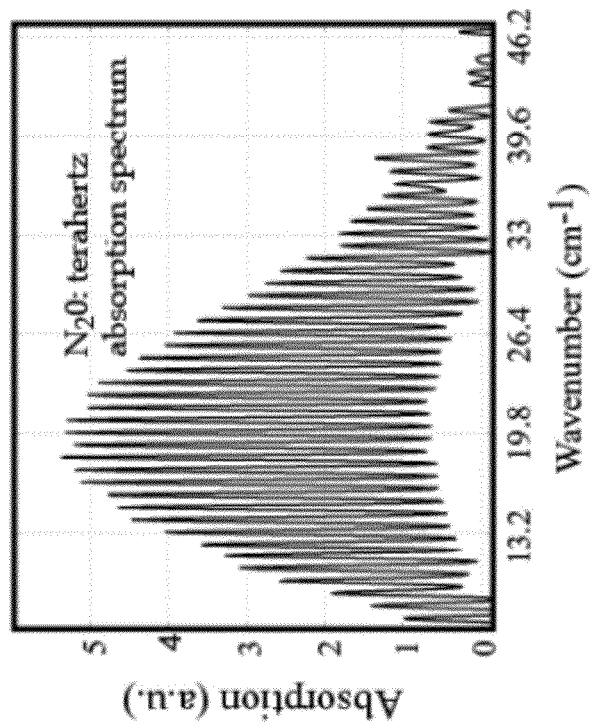
FIG. 2b is a graph showing the absorption spectrum of $N_2O$ gas.
Figure 2A:
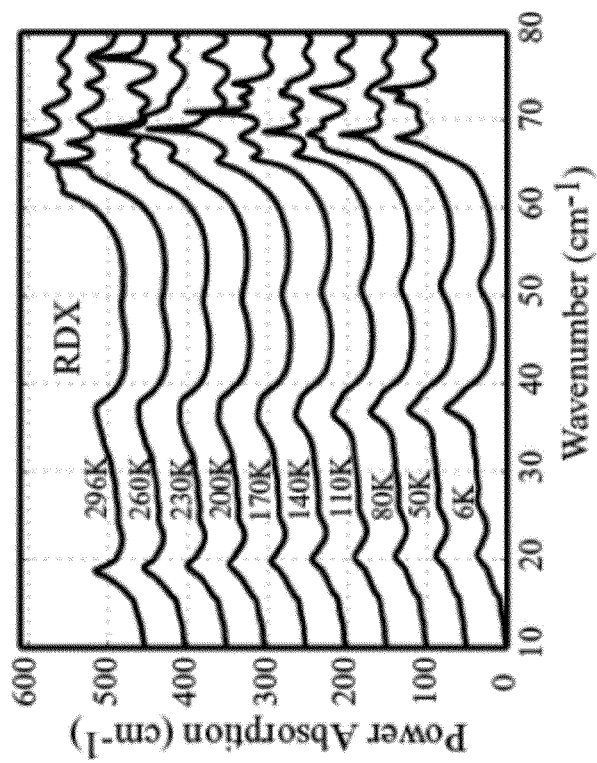
FIG. 2a is a graph showing the absorption spectrum of a single crystal of the explosive RDX.
Figure 3B:
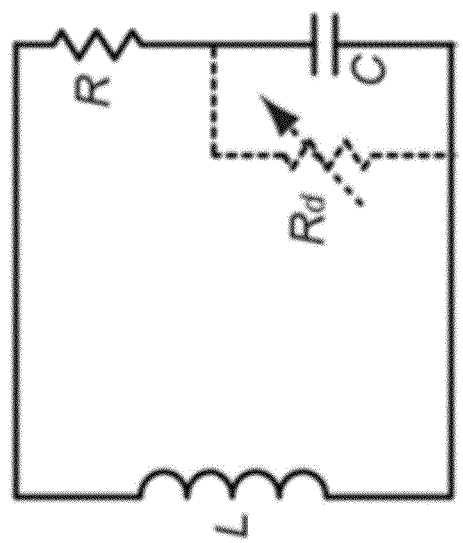
FIG. 3b is an effective circuit for a single SRR element.
Figure 3A:
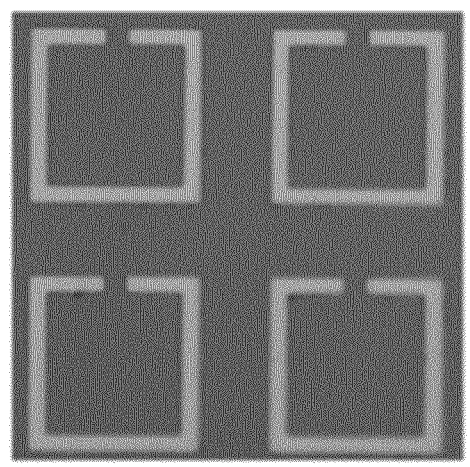
FIG. 3a is a micrograph of a portion of an array of SRRs fabricated on GaAs.
Figure 4:
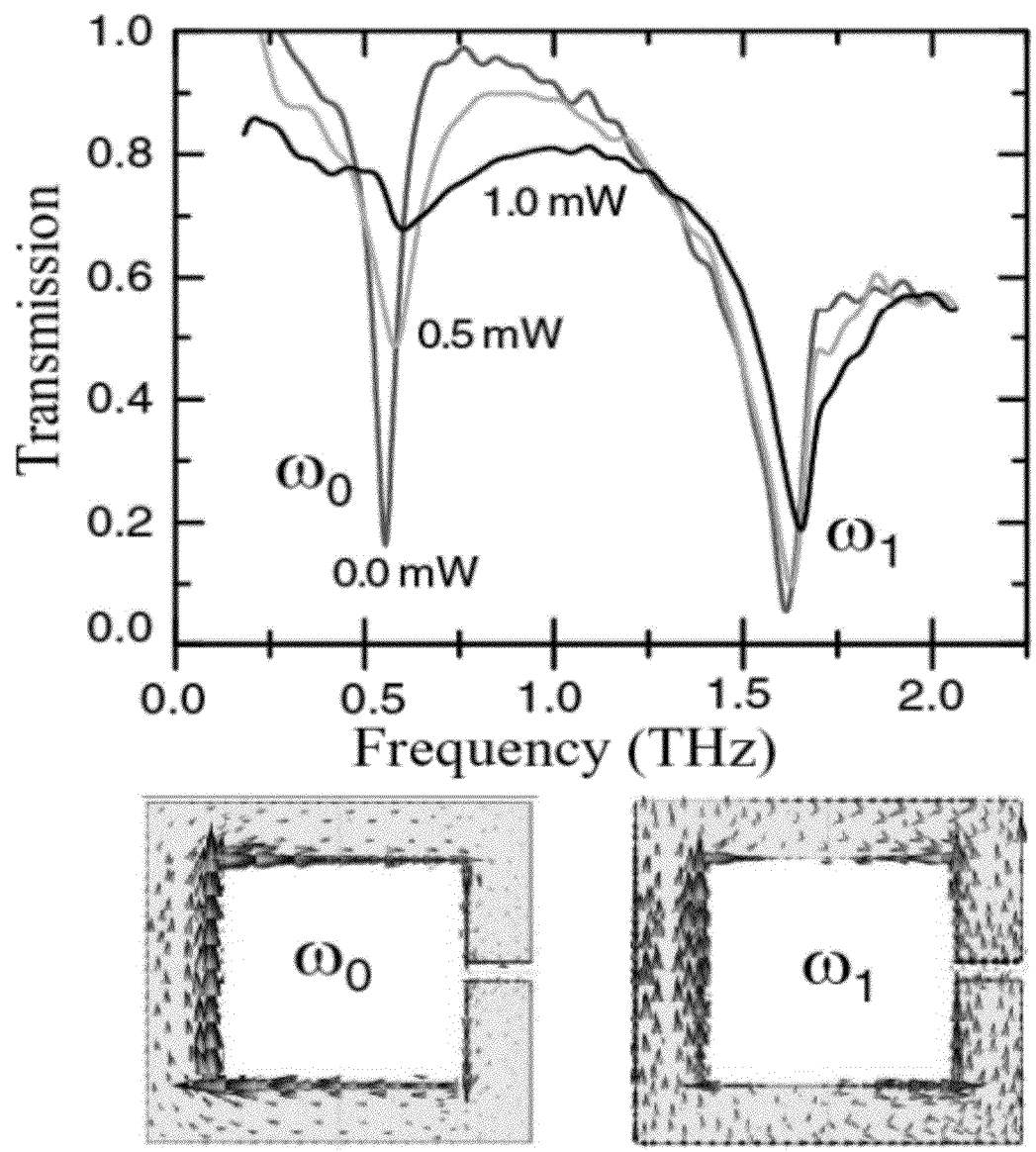
FIG. 4 shows the dynamic THz response of a planar array of Cu split ring resonators fabricated on GaAs.

Exclusive spectroscopy of dangerous materials. Spectra of most common dangerous materials including cyclotetramethylene-tetranitramine (HMX), cyclotrimethylene-trinitramine (RDX), pentaerythritol tetranitrate (PETN), and trinitrotoluene (TNT) have been investigated. The explosive materials have consistent features at frequencies in the vicinity of 600 GHz. See FIG. 2(a), Barber et al., and R. J. Foltynowicz et al., "Terahertz absorption measurement for gas-phase 2,4-dinitrotoluene from 0.05 THz to 2.7 THz," Chemical Physics Letters, vol. 431, pp. 34-38, Nov. 11, 2006. See also W. H. Fan et al., "Far-infrared spectroscopic characterization of explosives for security applications using broadband terahertz time-domain spectroscopy," Applied Spectroscopy, vol. 61, pp. 638-643, June 2007; C. Zandonella, "Terahertz imaging: T-ray specs," Nature, vol. 424, pp. 721-722, Aug. 14, 2003; Z. W. Zhang et al., "Terahertz time-domain spectroscopy for explosive imaging," Optik, vol. 118, pp. 325-329, 2007; Y. Hu et al., "Terahertz spectroscopic investigations of explosives," Physics Letters A, vol. 359, pp. 728-732, Dec. 11, 2006; H. B. Liu et al., "Detection and identification of explosive RDX by THz diffuse reflection spectroscopy," Optics Express, vol. 14, pp. 415-423, Jan. 9, 2006; and Y. C. Shen et al., "Detection and identification of explosives using terahertz pulsed spectroscopic imaging," Applied Physics Letters, vol. 86, Jun. 13, 2005.

Resolution. As the spatial resolution is inversely proportional to the frequency of the radiation, an imaging system would be desirable at as high a frequency as possible, given limitations in components and atmospheric propagation. Assuming the ideal diffraction limit of 650 GHz is ~$\lambda$/2, namely ~230 μm, which is sufficient enough for many safety scanning applications. See J. F. Federici et al., "Terahertz near-field imaging," Physics in Medicine and Biology, vol. 47, pp. 3727-3734, Nov. 7, 2002; G. C. Cho et al., "Apertureless terahertz near-field microscopy," Semiconductor Science and Technology, vol. 20, pp. S286-S292, July 2005; and K. Ishihara et al., "Terahertz-wave near-field imaging with subwavelength resolution using surface-wave-assisted bow-tie aperture," Applied Physics Letters, vol. 89, Nov. 13, 2006.

Low-cost illumination source. Finally, another technological challenge for active imaging rests on the development of components that operate at terahertz frequencies. Basically, for terahertz sources, the higher the operation frequency, the lower output power and the higher the cost. However, new techniques for THz wave generation are being developed in research laboratories and companies worldwide. Some terahertz sources such as terahertz backward wave oscillators with output powers of 20-100 μW at the frequency range of 600-1000 GHz are commercially available, with relatively low cost (see, for example, http://www.mtinstruments.com/thzsources/index.htm). And some groups have built terahertz generators with output power of ~3 mW at the frequency of 650 GHz which would be sufficient for a focal plane array having the sensitivity we can obtain. We note that the image quality depends on the illumination source and array size. Based on the output power of available terahertz sources, a first generation terahertz focal plane array consisting of 120× 80 pixels will be developed (for a proof of principle demonstration). The power incident on each pixel's power will be ~5 nW, which is nearly 2 orders larger than predicted noise power level. See M. A. Belkin et al., "Terahertz quantum-cascade-laser source based on intracavity difference-frequency generation," Nature Photonics, vol. 1, pp. 288-292, May 2007; A. V. Makul'kin, "Possible source of terahertz coherent synchrotron radiation based on an ultraminiature synchrotron," Atomic Energy, vol. 101, pp. 846-852, November 2006; G. Overton, "Tunable compact terahertz source is powerful, efficient," Laser Focus World, vol. 42, pp. 17-18, April 2006; G. A. Krafft, "Compact high-power terahertz radiation source," Physical Review Special Topics-Accelerators and Beams, vol. 7, June 2004; and D. Saeedkia et al., "A submilliwatt terahertz high-temperature superconductive photomixer array source: Analysis and design," IEEE Transactions on Applied Superconductivity, vol. 15, pp. 3868-3873, September 2005.

Principle of Cantilever-Based Substrate-Free Terahertz Radiation Detectors

Generally speaking, cantilever-based thermal detectors that embody the present invention include a metamaterial element that serves as a resonant THz absorber. This is particularly important at terahertz frequencies where it is difficult to find strongly absorbing materials that are compatible with standard processing techniques. The metamaterial is fabricated on top of a bi-material cantilever so that the absorbed radiation, being transformed to heat, will result in a deflection of the cantilever which can be easily monitored with a visible light beam. An advantage of this approach is that the free-standing cantilever is thermally isolated, thereby increasing the sensitivity, while the optical readout reduces noise issues associated with on-chip electronic detection. Additional advantages result from the fact that the detector pixels are sub-wavelength which improves the image quality, further reduces thermal noise, and enables, in principle, multi-resonance imaging applications. In what follows, we will describe the detector element in detail followed by our fabrication and characterization approaches.

Figure 5:
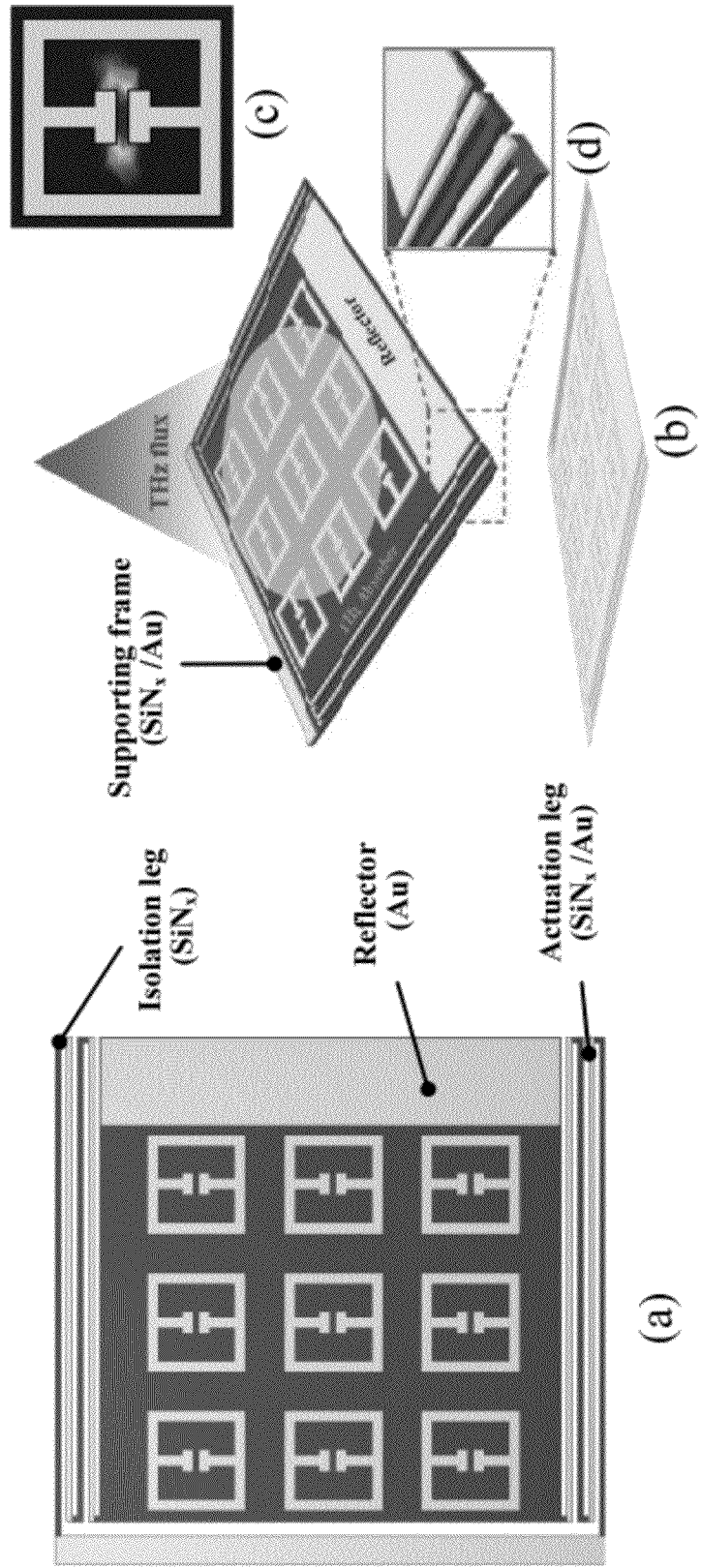
FIG. 5a and FIG. 5b show the major elements and materials of a cantilever-based substrate-free terahertz radiation detector in accordance with an embodiment of the invention.
FIG. 5c shows a simulation of the on-resonance electric field of a single SRR element.
FIG. 5d shows an enlarged view of the folded legs of the cantilever of FIG. 5b.

The microcantilever-based terahertz radiation detector employs arrays of thermally sensitive bi-material elements realized by MEMS technology. The pixel design and layout for one exemplary embodiment are shown in FIGS. 5a & 5b. The structure can be built on either insulating Si or GaAs wafers. The microcantilever has several components: (i) a Terahertz radiation absorption pad made by an array of gold (Au) split-ring resonators (SRRs) patterned on a Silicon Nitride ($SiN_x$) thin film, (ii) bi-material cantilever actuation legs, which are composed of layers of $SiN_x$ and Au which have a large coefficient of thermal expansion (CTE) mismatch, (iii) thermal isolation legs made of $SiN_x$ thin beams with a low thermal conductivity, (iv) an optically reflective surface for visible light readout of the thermal deflection of the cantilevers due to the absorption of terahertz radiation.

The SRRs concentrate energy in the gap region (simulation FIG. 5c), which enhances the terahertz radiation absorptivity and selectivity, and then converts it into heat. The bi-material actuation legs with substantial differences in CTE convert heat into mechanical movement. The folded legs configuration accumulates the deformation of all folds of the to increase the incline angle of the reflector, as shown in FIG. 5d. Each pixel is supported on the frame though the leg of last fold.

While the SRRs shown in FIGS. 5a-5c have a certain shape, SRRs having other shapes may also be used with the bi-material cantilever design to detect radiation having different frequencies. For example, the SRR in FIG. 18a may be used to detect radiation of about 0.095 THz, while the SRR is FIG. 18b may be used to detect radiation of about 0.690 THz. Dimensions (in microns) of these other SRRs are given in FIG. 18. Further, while example embodiments of the invention advantageously use various physical properties of $SiN_x$ and Au, other materials may be used in the fabrication of detectors in accordance with embodiments of the invention, provided that they meet the characteristics described herein.

The terahertz radiation detector has the following characteristics. First, the optical readout does not require metal interconnection on each pixel for measuring output as electrical readout system, thus enabling improved thermal isolation. Second, the folded legs configuration amplifies the thermally induced mechanical motion, thus increasing the incline angle of the reflector. Third, removal of the substrate below the detector element reduces air conduction to 1/104 of traditional thermal detectors, making it is unnecessary to put the detector in vacuum. Fourth, the architecture without the sacrificial layer and Si/GaAs substrate underneath the cantilevers eliminates adhesion, which is a vital defect of MEMS fabrication, thus simplifying the fabrication process. Fifth, SRRs have been demonstrated to have strong absorption over many decades of frequency. Thus, our design is not limited to THz frequencies but may be used over a large portion of the electromagnetic spectrum by simply scaling the SRR dimensions.

Design and Optimization of Terahertz Radiation Absorption

Generally speaking, the design of a THz radiation detector focal plane array (FPA) in accordance with an embodiment of the invention should maximize the pixel temperature increase and optimize the thermo-mechanical response for a given incident flux of terahertz radiation under the constraint of a predetermined pixel size. In addition, the fill factor should also be maximized. The thermal time constant of the pixel should be compatible with the frame rate of the CCD system (used in the imaging of the optical readout beam) to achieve detection at video rates (e.g. ~30 Hz).

Figure 6:
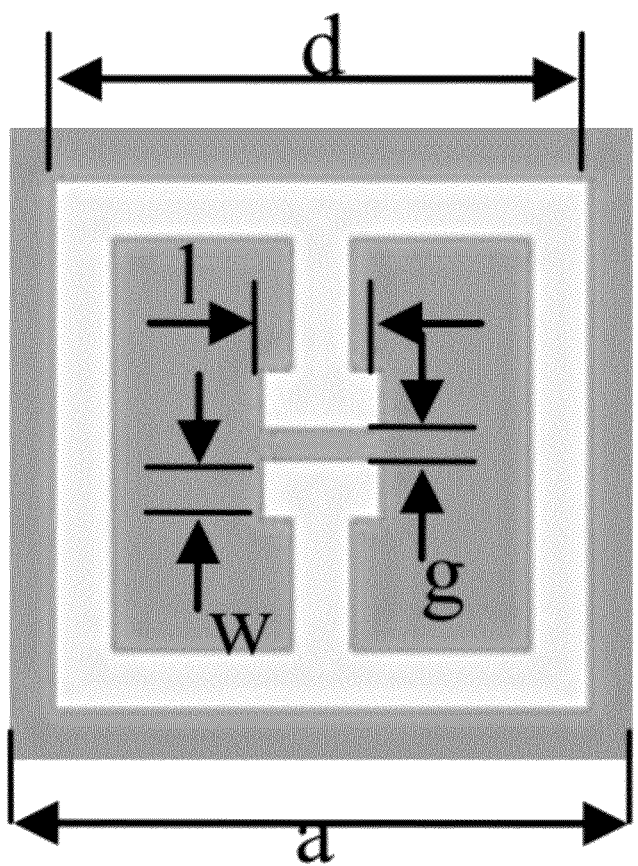
FIG. 6 shows a simulated SRR used to demonstrate strong absorption in a narrow band within the terahertz range.

The THz radiation absorber incorporated into a pixel should have a large absorptivity and, for active imaging applications, strong selectivity at the design frequency, in addition to having compatibility with IC and MEMS fabrication. The field transmission (S21) and reflection (S11) of the absorber with and without SRRs was performed using CST STUDIO SUITE 2006. A simulated absorber is shown in FIG. 6. The geometric parameters of the simulated SRR are: unit cell size (a)=50 µm, length of ring (d)=36 µm, width of ring (w)=4 µm, gap (g)=2 µm, and length of split gap (l)=8 µm. The absorption (Ab) was calculated by the following equation:

$$Ab=1-S_{11}^2-S_{21}^2$$

Figure 7A:
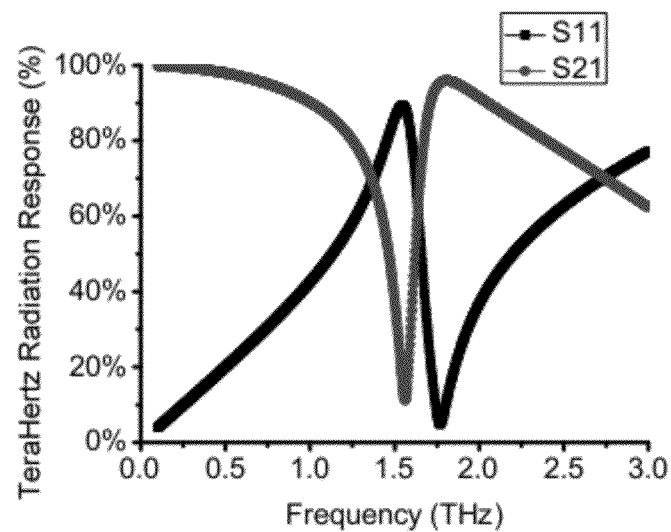
FIG. 7a shows the transmission and reflection of the SRR of FIG. 6 as a function of frequency.
Figure 7B:
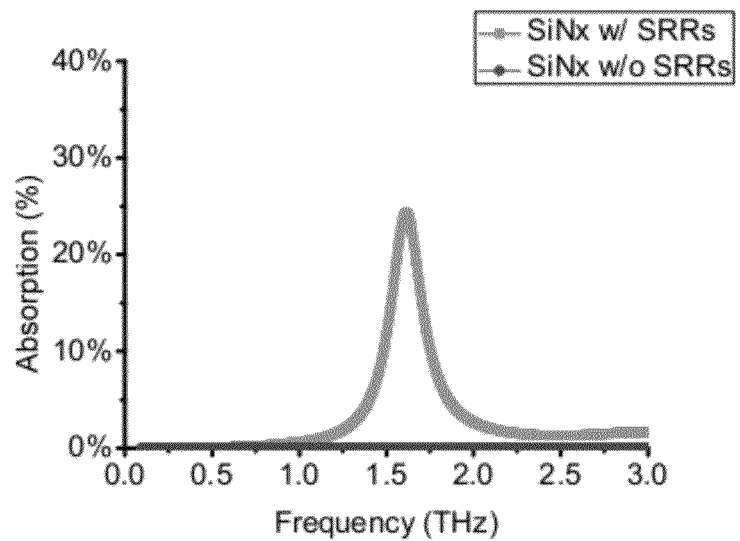

The simulation results show that the absorber has a strong resonance at about 1.6 THz, and the absorption can be significantly enhanced from nearly nothing to 25%, as shown in FIGS. 7a and 7b. This demonstrated absorptivity is what allows the bi-material cantilever approach to be used with terahertz frequencies. We should emphasize that an operation frequency (e.g., 650 GHz) can be chosen by simply changing the dimensions of our resonant metamaterial absorber. In addition, changing the metamaterial element to increase the absorptivity should increase in the sensitivity by a factor of 2-3.

Thermal Design of the Focal Plane Array (FPA)

Figure 8A:
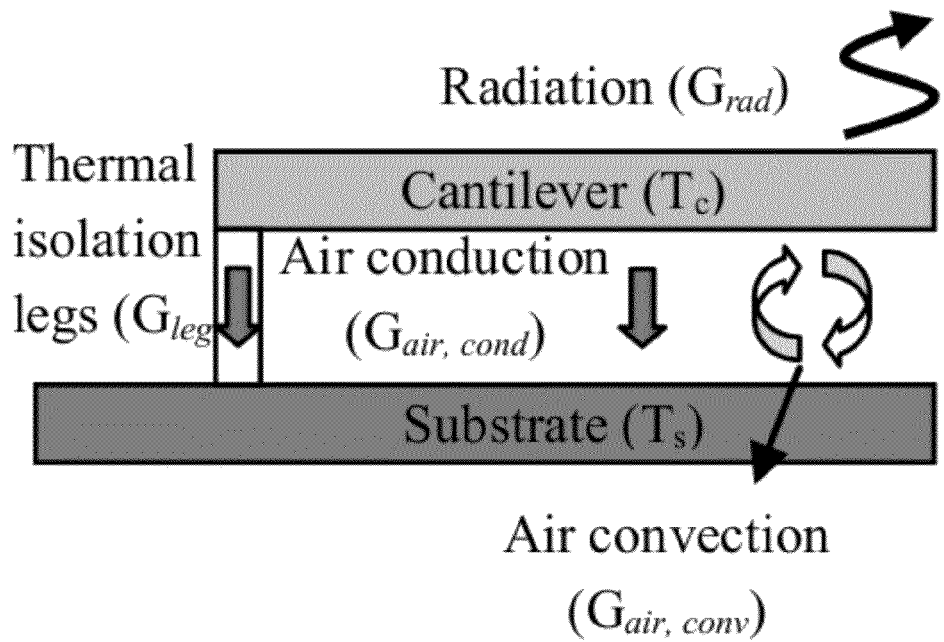
FIG. 8a is a schematic diagram of the heat transfer model of a microcantilever on the Si/GaAs substrate.
Figure 8B:
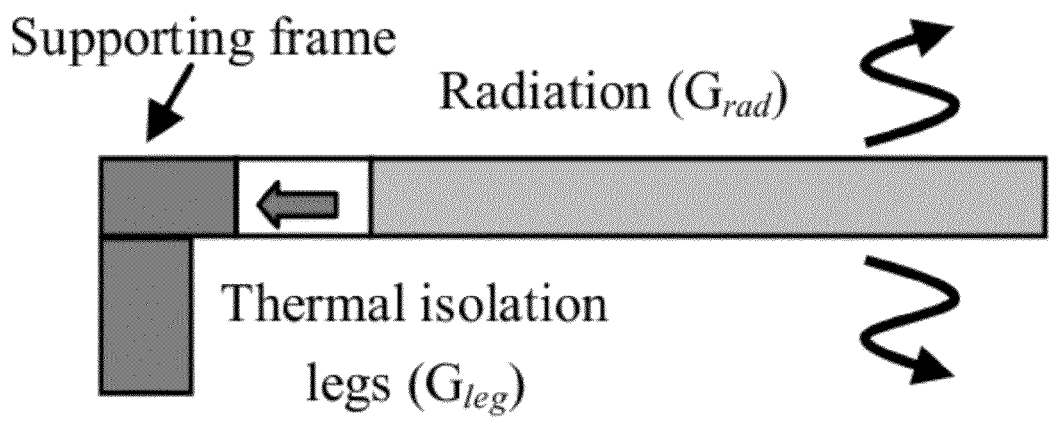
FIG. 8b is a schematic diagram of the heat transfer model of the substrate-free microcantilever.

This is a critical task, as the temperature rise of the microcantilever is directly related to how well the cantilever is thermally isolated from the environment. With regards to addressing this issue, the device has to be thermally isolated from the substrate, which is highly thermally conductive. An appropriate choice of material for the thermal isolation legs is therefore crucial. The bi-material bending of the terahertz radiation detector is induced by the temperature increase upon terahertz radiation absorption. Upon the absorption of thermal energy, the temperature rise of the micro cantilever can be determined by:

$$\Delta T=q/G_{Total}$$

where q is the absorbed power and $G_{Total}$ is the total thermal conductance between the cantilever and its surroundings. There will be heat exchange between the structure and its environment when the structure temperature is higher than the environment temperature, as shown in FIG. 8. To maximize ΔT, $G_{Total}$ should be minimized. The heat exchange mechanisms of a prior art, substrate-based cantilever in FIG. 8a can be categorized as:

$$G_{Total}=G_{leg}+G_{rad}+G_{air,cond}*G_{air,conv}*$$

where the heat conduction between the cantilever and the supporting frame through the thermal isolation leg is $G_{leg}$; the heat exchange between the cantilever and the environment through thermal radiation is $G_{rad}$; the heat conduction between the cantilever and substrate through air is $G_{air,cond}$*; and the heat convection between the cantilever and substrate through air is $G_{air,conv}$*. However, the two starred heat exchange mechanisms are not applicable in a substrate-free detector in accordance with embodiments of the present invention, as shown in FIG. 8b. Therefore, only the first two heat exchange mechanisms are analyzed in detail.

Thermal conductance loss: The thermal conductance between the cantilever and supporting frame $G_{cond}$ is a function of the geometry of the folded legs and the thermal conductivity of the materials:

$$G_{cond} = 2\frac{1}{n\left(\frac{1}{G_{act}} + \frac{1}{G_{iso}}\right)} = 2\left[\frac{nL}{k_{SiNx}A_{SiNx} + k_{Au}A_{Au}} + \frac{nL}{k_{SiNx}A_{SiNx}}\right]^{-1}$$

where $G_{act}$ is the thermal conductance loss of the bi-material actuation leg, $G_{iso}$ is the thermal conductance loss of isolation leg, n is the fold number, L is the leg length in one fold, A is the cross-sectional area of the leg, and k is the thermal conductivity coefficient of the leg material. Therefore, based on parameters given in Tables 1 and 2 below, the thermal conductance in an exemplary $SiN_x$/Au embodiment with 2 folded legs is $G_{cond}$=3.28×10$^{-8}$ W/K. Table 1 is derived from B. Li, "Design and simulation of an uncooled double-cantilever microbolometer with the potential for similar to mK NETD," Sensors and Actuators A-Physical, vol. 112, pp. 351-359, May 1, 2004.

Therefore, the thermal conductance from folded legs may be closely approximated as $G_{rad}$=2.95×10$^{-7}$ W/K.

Detection frame rate; time constant of the pixel: For an imaging system, the imaging frame rate should be within 10-30 Hz to be compatible with the response of human eyes. As a thermal sensor, the detection frame rate depends on the time constant of the pixel, which indicates the time that the system needs to reach steady state, and can be described in the following equation:

$$\tau = \frac{\sum \rho_i V_i c_i}{G_{total}}$$

where c is the heat capacity, ρ is the density and V is the volume. Notice that the time constant is inversely proportional to the thermal conductance. As a result, there is a trade-off between the frame rate and the sensitivity of the sensor. For the parameters given in Tables 1 and 2, the time constant of the above exemplary design is calculated to be about 0.0578 sec. So for this design, the frame rate is about 17 Hz, within the acceptable range.

Analysis and Optimization of Thermal Mechanical Response

The deflection of the cantilever due to THz radiation induced temperature change is optimized as follows. The deflection is a function of the mechanical properties of the materials, the difference in the CTE of the two materials in the bi-material actuation legs, and the length and thickness of the folded legs. A folded legs configuration accumulates the deformation caused by the CTE mismatch to increase the

TABLE 1

Thermophysical properties of materials

| | Young's modulus (GPa) | Poisson ratio | Expansion coefficient (×10$^{-6}$ K$^{-1}$) | Thermal conductivity (W/(m·K)) | Heat Capacity (J/Kg·K) | Emissivity | Density (g/cm$^3$) |
|---|---|---|---|---|---|---|---|
| Au | 73 | 0.42 | 14.2 | 296 | 132 | 0.01 | 19.30 |
| SiN$_x$ | 180 | 0.26 | 3.2 | 5.5 | 333 | 0.8 | 2.44 |

TABLE 2

Dimension of microcantilever unit

| Unit Size (μm) | Reflector (μm) | Leg length (μm) | Leg width (μm) | Au thickness (μm) | SiNx thickness (μm) | Frame width (μm) | Fold number |
|---|---|---|---|---|---|---|---|
| 200 × 200 | 180 × 25 | 180 | 2 | 0.4 | 0.55 | 10 | 2 |

Figure 9:
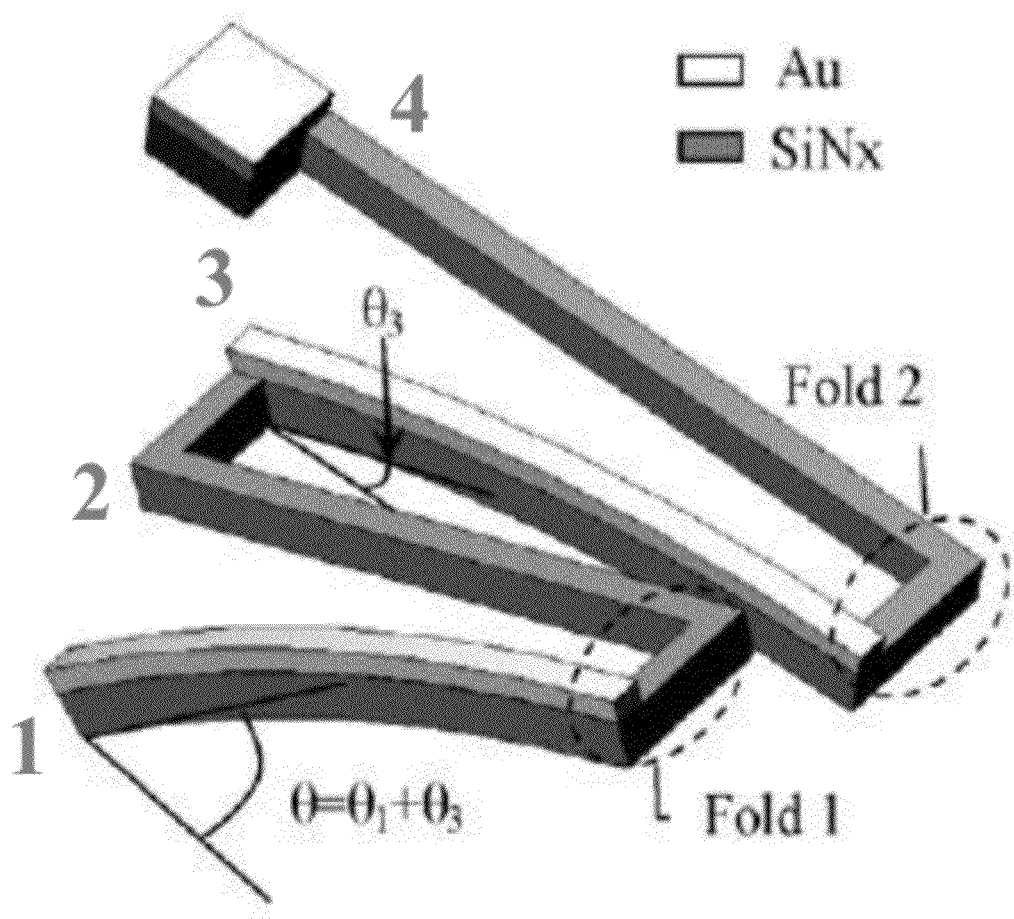
FIG. 9 shows a folded legs configuration for deformation magnification in an embodiment.

Thermal radiation loss: According to the Stefan-Boltzmann law, for the bi-material cantilever beam, the net rate of radiation heat transfer from the cantilever surface is:

$$q_{rad} = \sigma(A_{ref}\epsilon_{Au} + A_{top}\epsilon_{SiNx} + A_{bottom}\epsilon_{SiNx})(T_{can}^4 - T_a^4)$$

where σ is the Stefan-Boltzmann constant (5.67×10$^{-8}$ W/m$^2$K), $A_{ref}$ is the area of the reflector, $A_{top}$ is the area of the cantilever's top surface, $A_{bottom}$ is the area of the cantilever's bottom surface, $T_{can}$ is the temperature of the cantilever, $T_a$ is the ambient temperature, and c is the emissivity of the relevant material. Since $T_{can}$ is actually very close to $T_a$, we can linearize this equation to be:

$$q_{rad} = 4\sigma T_{can}^3(A_{ref}\epsilon_{Au} + A_{top}\epsilon_{SiNx} + A_{bottom}\epsilon_{SiNx})(T_{can} - T_a) = G_{rad}(T_{can} - T_a)$$

incline angle of the reflector, as shown in FIG. 9. Because the thermal conductance of $SiN_x$ is much lower than that of Au, it can be reasonably assumed that the temperature gradient of the fold concentrates on the $SiN_x$ legs, and the $SiN_x$—Au legs are isothermal. The same will be true in other embodiments whose materials have a sufficiently large difference in their CTE. Likewise, because of the same thermal conductance of each fold, the temperature gradient on each fold is equivalent, thus the temperature rise of leg 3 is half that of leg 1 when the microcantilever temperature increases. For a thermo-inducing deformation of the structure, leg 3 has an inclination angle $\theta_3$ to the fixed end of leg 4, and leg 1 has an inclination $\theta_1$ in the same bending direction. Hence, the incline angle of reflector is the sum of two folds ($\theta_{Total} = \theta_1 + \theta_3 = 1.5\theta_1$).

The curvature responsivity is related to the CTE mismatch by:

$$\Re^{(\kappa)} = \frac{\kappa}{T-T_a} = \frac{1}{h_1} \frac{6\gamma r(1+r)}{1+4\gamma r + 6\gamma r^2 + 4\gamma r^3 + \gamma^2 r^4}(\alpha_2 - \alpha_1)$$

where h is the thickness of each material and $r=h_2/h_1$, E is the Young's modulus for legs or biaxial modulus for plates, $\gamma=E_2/E_1$, and $\alpha$ is the film CTE. For a larger thermal-mechanical response, the CTE mismatch of the bi-material actuation legs should be as large as possible, but in any event the mismatch should be substantial enough to cause a detectable deflection for a given minimal incident radiation flux, the minimal flux being determined as a function of the given industrial application.

The thermo-mechanical sensitivity $S_T$ is defined as the incline angle change $\Delta\theta$ of the reflector for the temperature change $\Delta T$ of the microcantilever. For a one-fold deformation structure, the incline angle response of reflector can be expressed by:

$$S_T = \frac{L}{h} \frac{6\gamma r(1+r)}{1+4\gamma r+6\gamma r^2+4\gamma r^3+\gamma^2 r^4}(\alpha_2-\alpha_1) = \frac{L}{h_1} f(r)(\alpha_2-\alpha_1)$$

It is well known that, while the Young's modulus of Au remains relatively stable for different fabrication processes, the Young's modulus of $SiN_x$ strongly depends on the deposition conditions such as temperature, pressure and the ratio of the flow rate of source gases during deposition. With regards to optimizing the thickness ratio using the responsivity equation, the Young's modulus of $SiN_x$ thin film at specific deposition conditions was determined.

Figure 10:
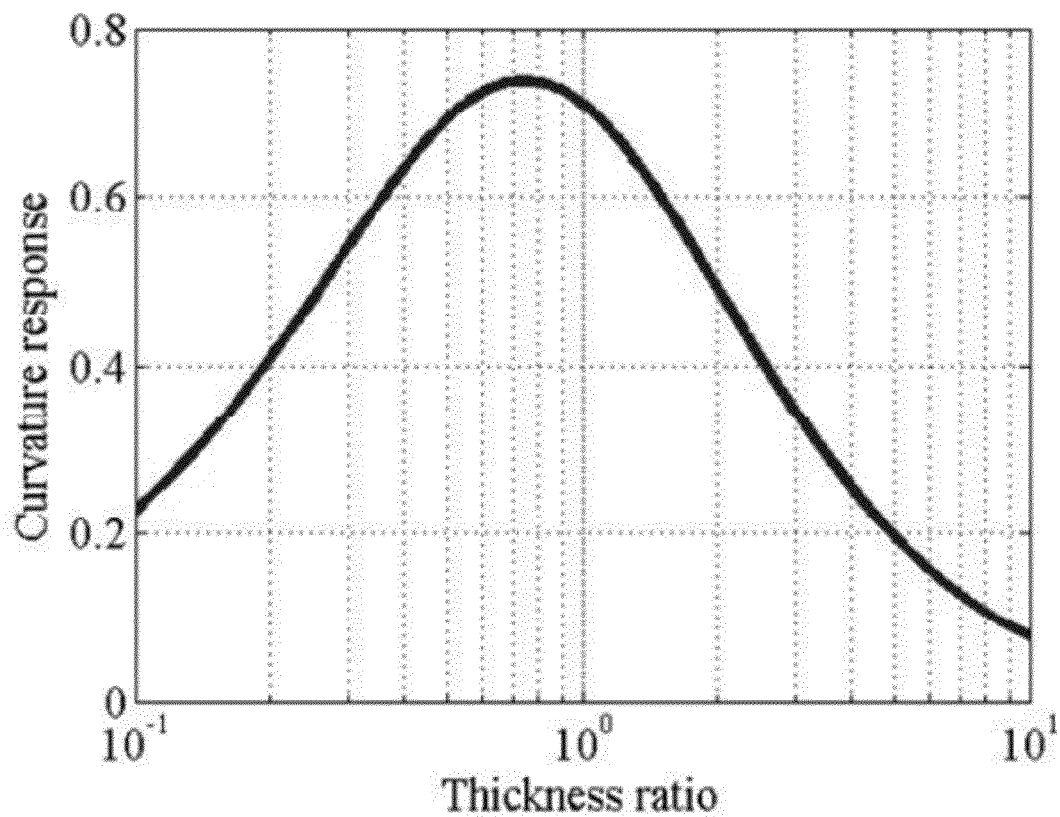
FIG. 10 shows curvature response of the cantilever as a function of the ratio of thicknesses of its two constituent materials.

FIG. 10 plots the curvature response as a function of thickness ratio r. Thus $r_{max}$=0.74 and $f_{max}$=0.74 for $\gamma$=0.405 (i.e., when $E_1$=180 MPa for LPCVD deposited $SiN_x$ and $E_2$=73 MPa for Ebeam-evaporated Au). Assuming the thickness of gold layer is 400 nm, the optimized thickness of $SiN_x$ layer for maximum curvature response is about 540 nm. Different pairings of materials will have a different value of $\gamma$ and therefore different curvature response values that correspond to a different $r_{max}$ and $f_{max}$.

Figure 11B:
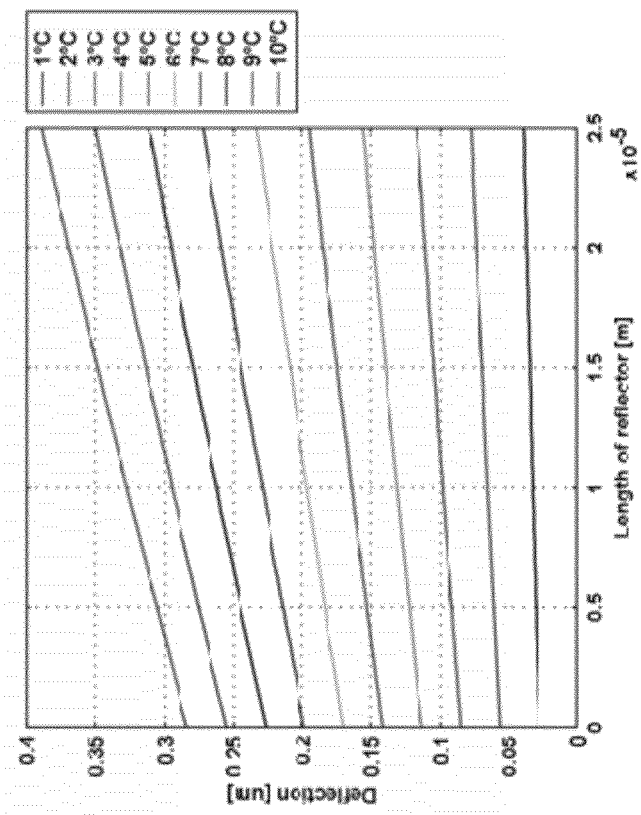
Figure 11A:
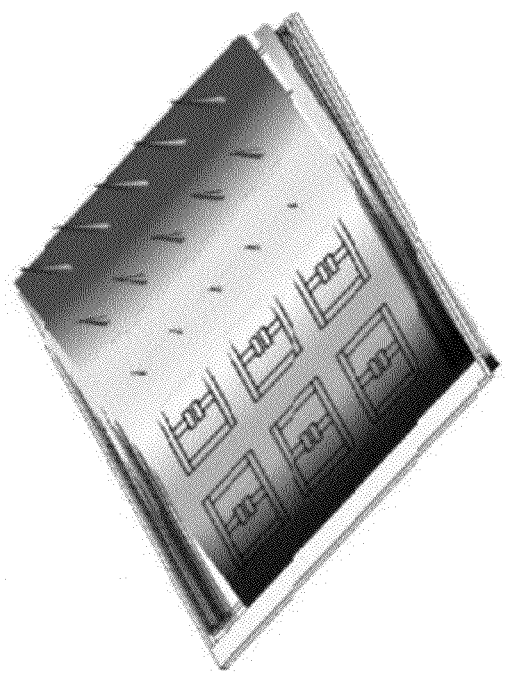
FIG. 11a shows 3D deflection of a simulated detector (where arrows show the deflection direction and amplitude)

For a 2-fold deformation structure, the incline angle of reflector is 1.5 times the sensitivity $S_T$, as explained above. Therefore, the incline angle response $S_T$=0.233 deg/K, and the deflection response $S_D$=0.056 µm/K. A finite element simulation of thermal mechanical response of the detector has been performed using COMSOL, as shown in FIGS. 11a and 11b, and matches the theoretical calculation.

Microfabrication and Post-Processing Cantilever Curvature Modification

Figure 12:
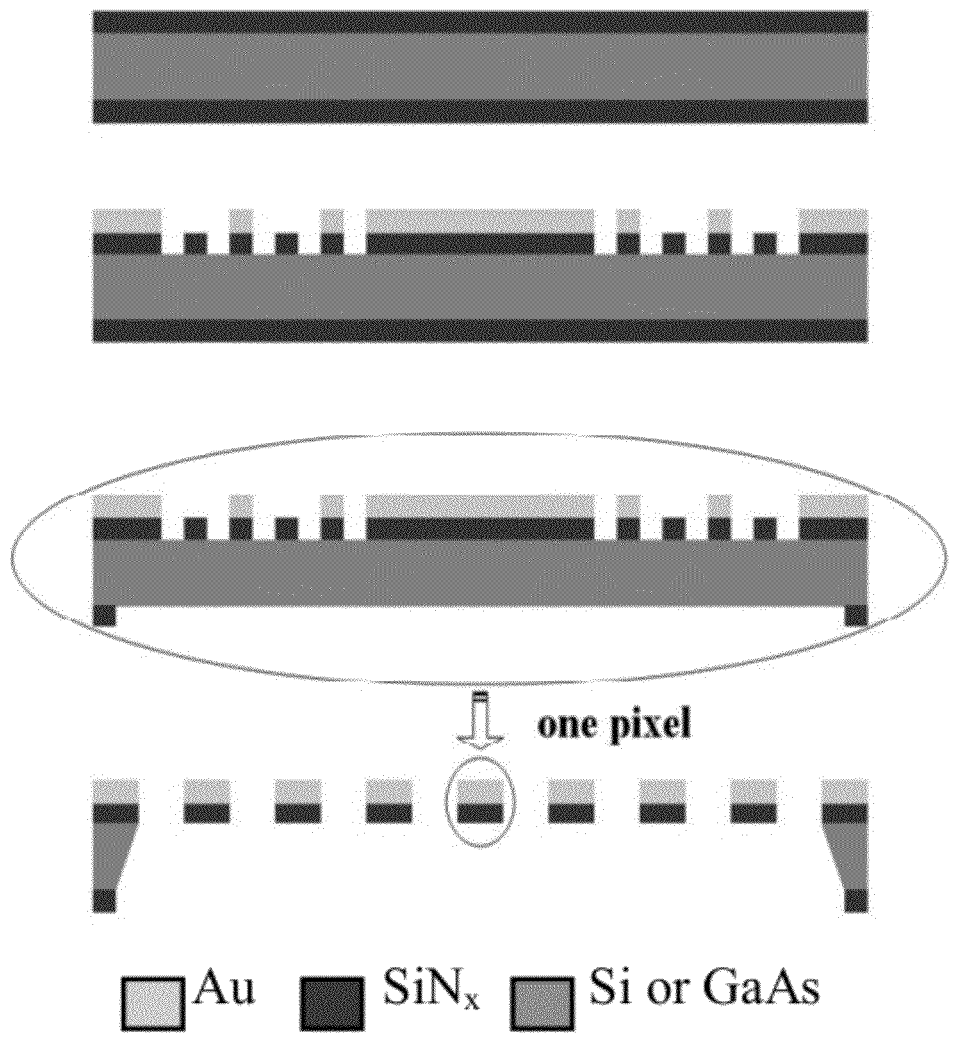
FIG. 12 shows the main steps of manufacturing cantilever-based substrate-free THz radiation detectors in accordance with an embodiment of the invention.

Microfabrication. An FPA in accordance with an embodiment of the invention can be fabricated using surface micromachining technology. As shown in FIG. 12, the detectors can be built on either silicon or GaAs substrates, and the process typically consists of five steps, namely, deposition of the $SiN_x$ film, patterning the $SiN_x$ layer, patterning the Au layer, patterning the backside etching window and releasing the structure.

Figure 13:
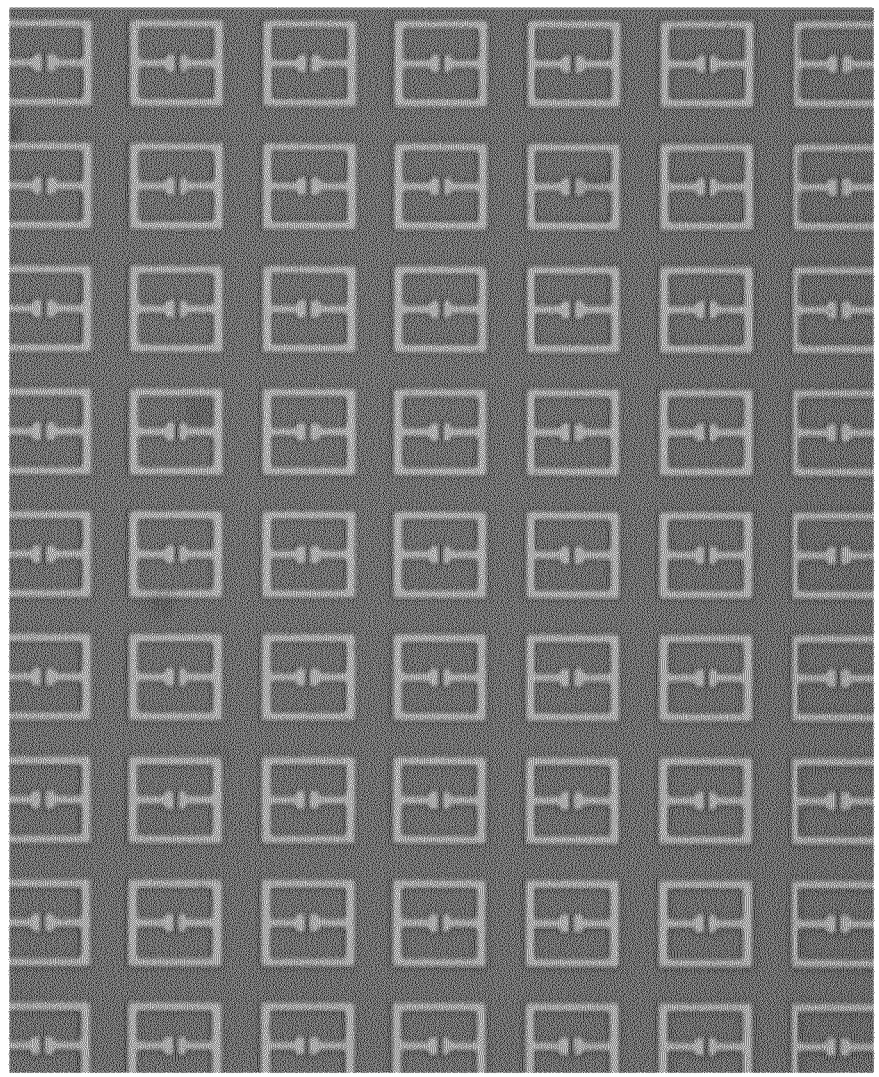
FIG. 13 shows a micrograph of a portion of an array of SRRs fabricated on GaAs.

The first step in fabricating one embodiment is deposition of a low-stress $SiN_x$ layer on both sides using LPCVD or PECVD. $SiN_x$ on the top surface is patterned by photolithography, followed by employing reactive ion etching (RIE) to remove the unwanted $SiN_x$ area. A layer of Au/Ti is E-beam evaporated, followed by lift-off with rinsing in acetone. Then the backside window is patterned by photolithography followed by RIE etching. Finally, the Si/GaAs substrate beneath the FPA element is etched either in KOH solution (for Silicon wafers) or by deep reactive ion etching (DRIE) (for both Silicon wafers and GaAs wafers). FIG. 13 shows a fabricated metamaterial sample (Au on GaAs).

Figure 14:
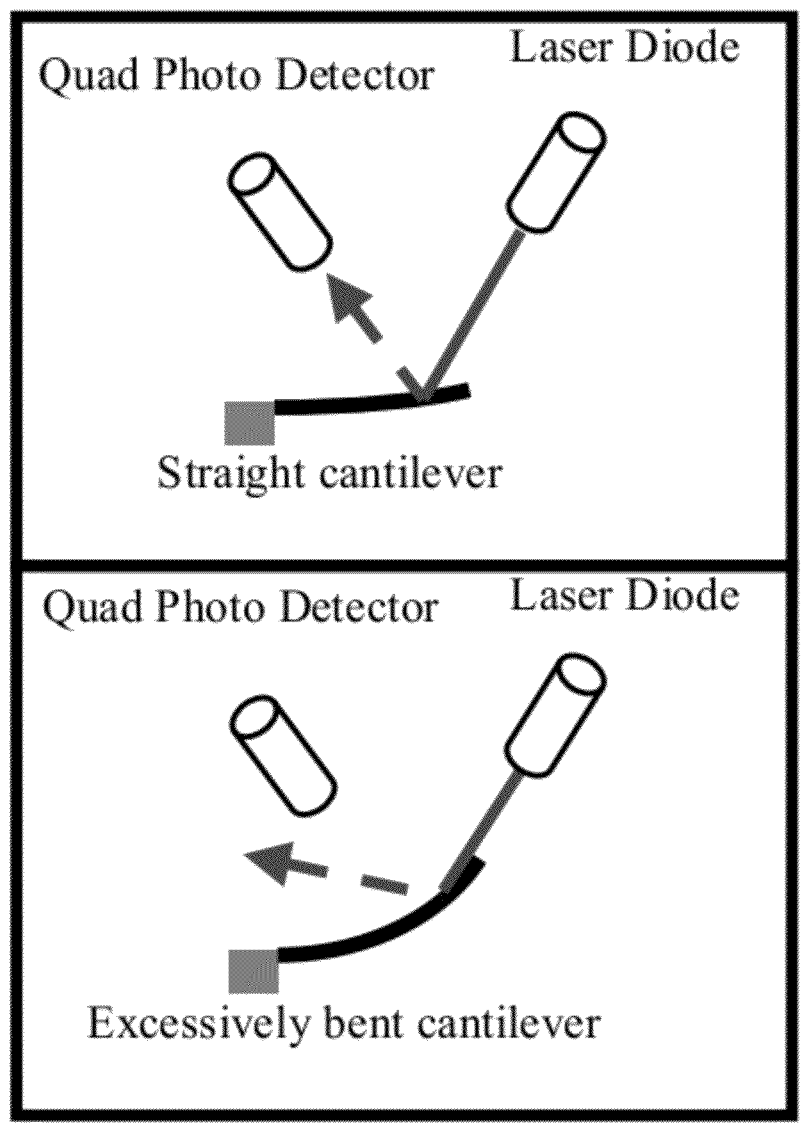
FIG. 14 shows misalignment of the optical readout due to initial, over-bended curvature of a cantilever.

Post-processing. There will be initial bending of the cantilevers, which originates from residual stress in or between the films. Residual stresses resulting from thin film fabrication and structure release are the principal source of bent errors in micromachined structures. Stress gradients are particularly troublesome, because even relatively small stress variations through the thickness of a thin film can cause significant, undesirable curvatures of the cantilever, which severely influence the performance of the optical readout system. Misalignment of the laser with the detector will occur when the bending of the cantilever is too large, due to the limited adjustment and degrees of freedom of the optics in the AFM-like system, as shown in FIG. 14.

Rapid thermal annealing (RTA) can eliminate the unwanted curvature in the bi-material based cantilever structures. In comparison with conventional furnace annealing, rapid thermal annealing can reduce or eliminate residual stresses in thin films in a very short time. Thus, adverse effects due to high-temperature annealing on devices can be minimized.

Figure 15:
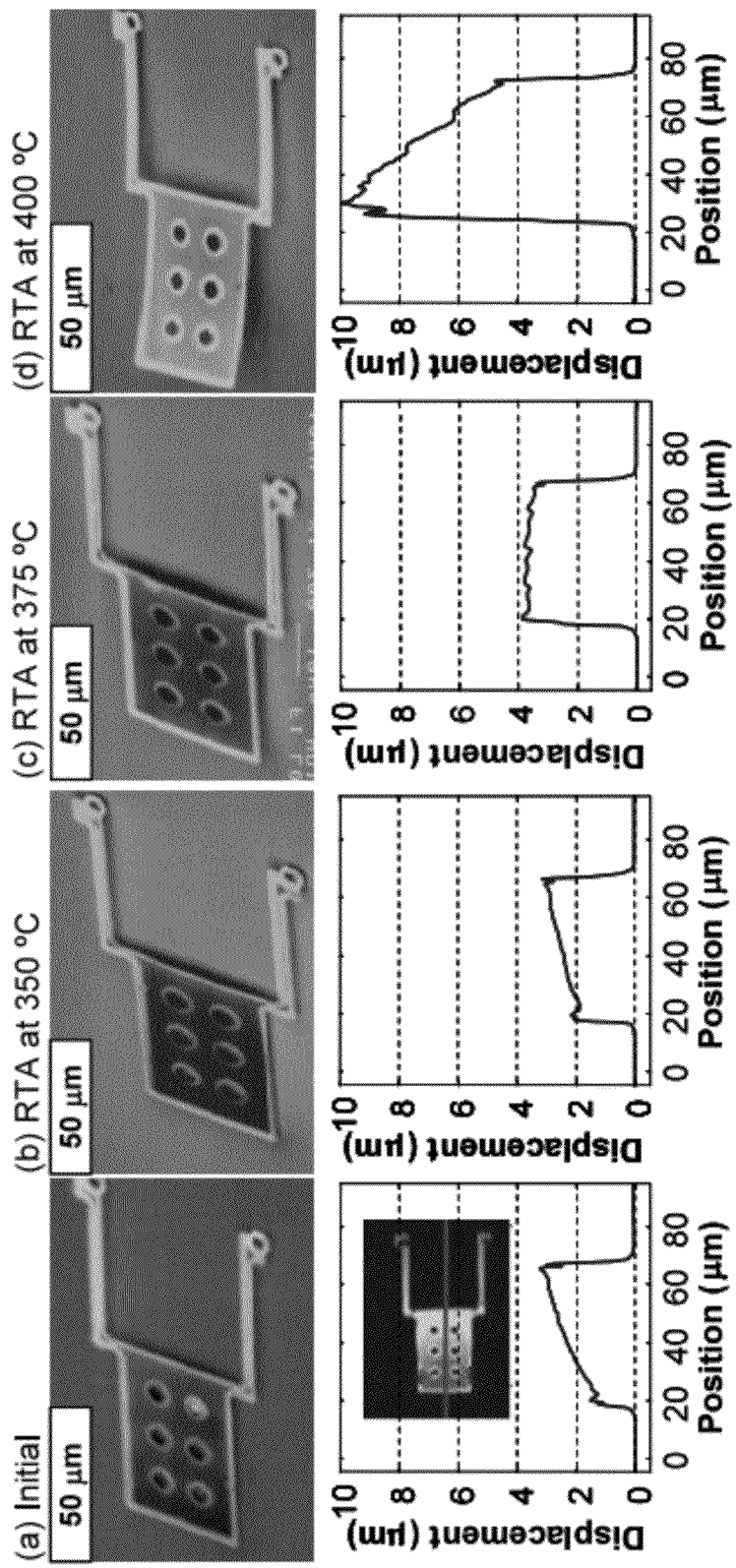
FIGS. 15a-d show SEM pictures of IR detectors controlled by rapid thermal annealing at the indicated temperatures.

FIG. 15 shows an experiment on micro IR detectors that we have conducted to eliminate unwanted curvature. As can be seen, the as-fabricated focal plane arrays initially bent down with unwanted curvatures. However, the surface profile was changed by RTA at different temperatures: (a) the initial $SiN_x$/Al pixel deflected downward with a negative curvature; (b) Rapid thermal annealing at 350° C., reduced the deflection of the pixel; (c) at 375° C., made the pixel almost flat; and (d) at 400° C., changed the pixel curvature from negative to positive.

Performance Characterization

Characterization includes measurements of contour errors, cantilever planarity, residual stress, thermo-mechanical transduction, and the dynamic response. Several characterization techniques may be used to probe the actual effects of the micromachining process on the material at the micromechanical level. A suite of experimental tools are available to characterize the fabricated devices. This includes an SEM and a commercial white light interferometer for surface profiling.

The characterization of the far-infrared electromagnetic response may utilize a mechanically tuned Gunn oscillator (for 95 GHz), a backward wave oscillator (for 650 GHz) and terahertz time domain spectroscopy (THz-TDS). THz-TDS is a time-domain technique whereby near-infrared optical pulses are down-converted to coherent THz pulses. A ~100 femtosecond optical pulse is short enough to drive a picosecond transient polarization or current surge which results in the emission of a temporally coherent broadband THz electromagnetic pulse. An optical pulse incident on the THz emitter generates a burst of THz radiation that is subsequently collimated and propagated in a quasi-optical fashion. After being focused onto and transmitted through a sample, the residual THz radiation is collected and detected using another optical pulse to temporally gate a THz receiver. With gated detection, the THz radiation is measured with an extremely high signal-to-noise ratio without the need for a cooled detector such as a bolometer. Importantly, both the electric field amplitude and phase are measured in the time-domain enabling the direct determination of electromagnetic response without model assumptions and without the need for Kramers-Kronig transforms. This technique permits characterization and optimization of the metamaterial response. The subsequent characterization of the detector pixels may proceed with a Gunn diode and CW backward wave oscillator.

In the optical readout mode, the THz radiation induced cantilever deflection is converted to a deflection of the cantilever, which can be measured with a laser beam and a quadrant photodetector as routinely employed in AFM systems. Typically, one optimizes the single pixel response prior to proceeding with the more difficult task of characterizing arrays of pixels that may be, for example, 120×80 pixels in size.

Figure 16:
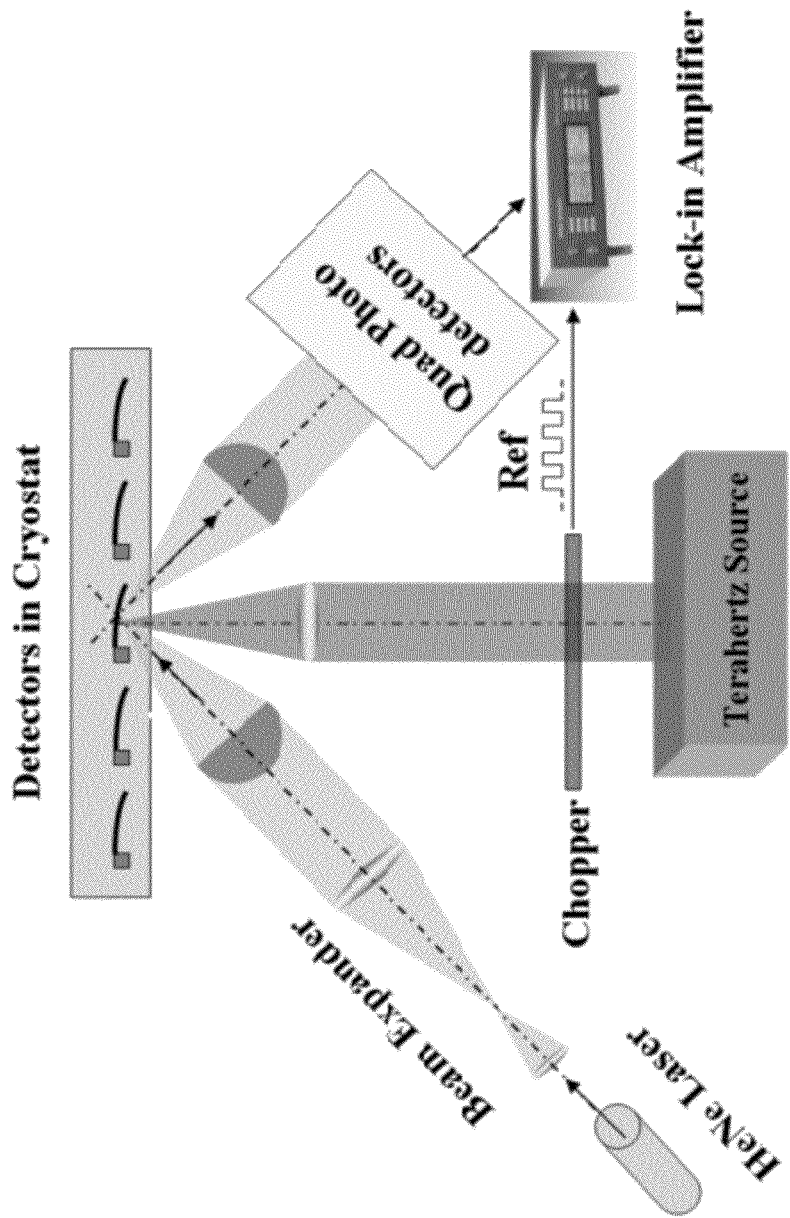
FIG. 16 shows a schematic for characterization of a single pixel.

The characterization of a single pixel may be conducted using such an AFM-like system, as shown in FIG. 16. A small amount of power from a power stabilized laser beam is focused onto the reflector of the cantilever, and is reflected back to a quad-photodiode detector. The terahertz source is modulated using a chopper to enable lock-in amplifier detection. The resultant change in the photodiode differential signal is a proportional measure of the cantilever deflection, which leads to measurement of cantilever deflection with nanometer resolution. For the initial characterization, one might use a single pixel that is resonant at 95 GHz as there are inexpensive sources with sufficient power to allow for straightforward characterization of the sensitivity, linearity, and minimum detectable signal. To characterize the source at this frequency one may use a backward wave oscillator capable of generating ~50 µW of power. Subsequent to the single pixel characterization, one proceeds with the fabrication of the arrays which have been optimized based on the characterization of the individual pixels.

Figure 17:
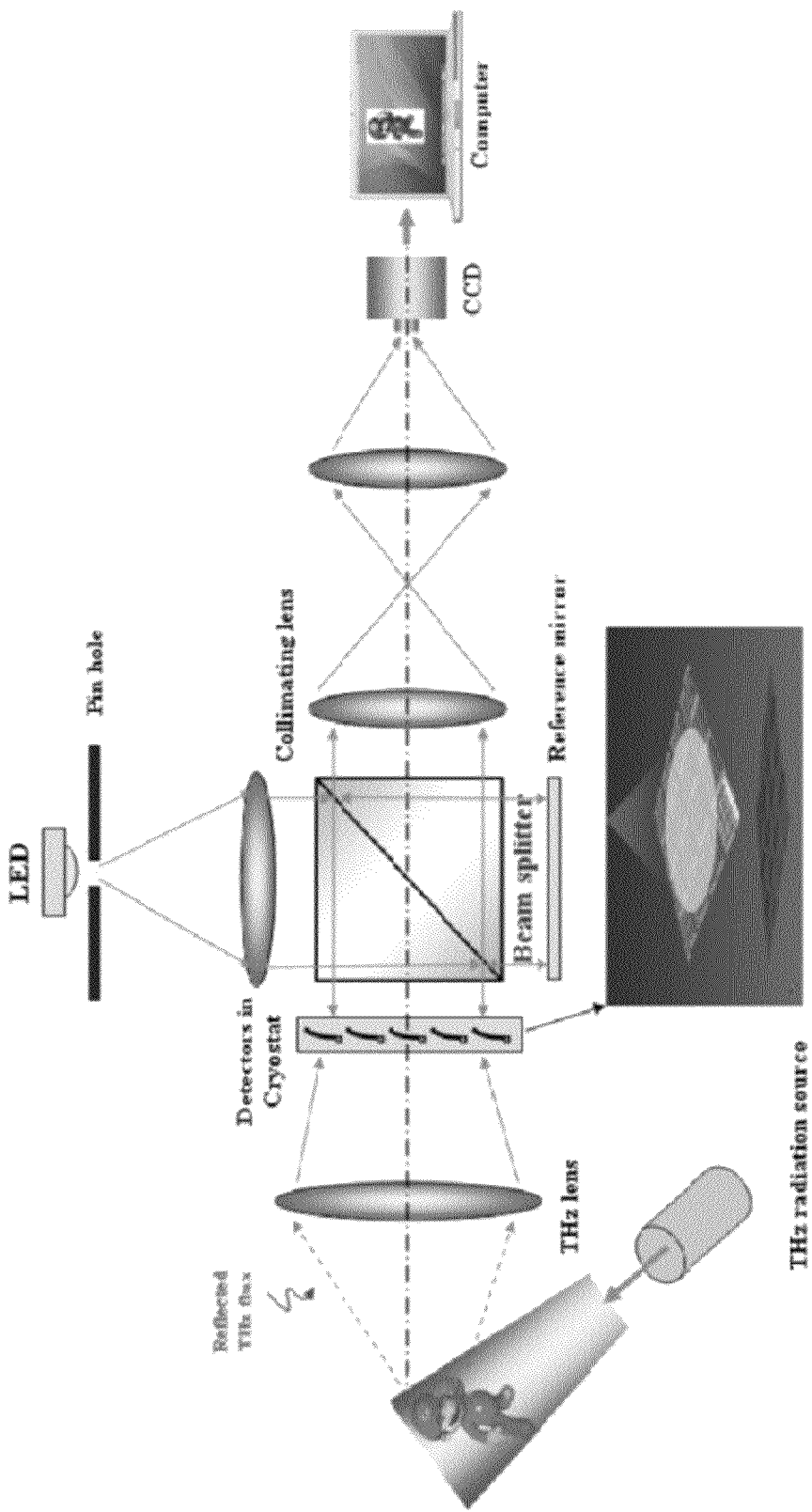
FIG. 17 show a schematic for optical readout of a THz active imaging system in accordance with an embodiment.

An optical readout for an FPA is a data-acquisition method that measures each pixel's deflection optically as opposed to electronically. The goal of the optical readout is to simultaneously image the deflection of all of the pixels with nanometer resolution using a visible CCD/CMOS imager to obtain an intensity map based on the collective deflections. A simplified schematic is depicted in FIG. 17. The cantilever array is back-illuminated with THz radiation imaged from the source. This enables for the optical readout to be incorporated in a way that utilizes a simple interferometer coupled with a CCD camera. Terahertz induced variations in the optical intensity imaged onto a CCD will occur due to interference of the reference beam with the beam incident on the terahertz detector array. An initial characterization may proceed using a highly reflective object to permit maximal THz throughput. The optical readout is fairly straightforward, but requires a well-stabilized source to minimized noise due to intensity fluctuation in order to obtain shot-noise limited performance of the optical readout system. As with the single pixel, the response is characterized as a function of the incident power, and the response time of the arrays may be characterized with a goal of achieving near video refresh rates which would enable real-time imaging of THz illuminated objects.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. An apparatus for detecting terahertz radiation at room temperature, the apparatus comprising:
   a substrate; and
   a detection structure including (a) an optically reflective surface, and (b) a radiation absorption pad having formed thereon a split-ring resonator, the split-ring resonator having a characteristic dimension, and an electrical resonance frequency corresponding to a wavelength of the terahertz radiation that is greater than the characteristic dimension;
   the detection structure being coupled to the substrate by a flexible cantilever comprising (a) a plurality of actuation legs formed from two materials having substantially different coefficients of thermal expansion, and (b) a plurality of thermal isolation legs having substantially lower thermal conductivity than the actuation legs.

2. An apparatus according to claim 1, wherein the substrate comprises a silicon (Si) wafer or a gallium arsenide (GaAs) wafer.

3. An apparatus according to claim 1, wherein the detection structure comprises a silicon nitride ($SiN_x$) thin film.

4. An apparatus according to claim 1, wherein the optically reflective surface is formed from gold (Au).

5. An apparatus according to claim 1, wherein the plurality of actuation legs are formed from layers of silicon nitride ($SiN_x$) and gold (Au).

6. An apparatus according to claim 1, wherein the plurality of thermal isolation legs are formed from silicon nitride ($SiN_x$).

7. An apparatus according to claim 1, wherein the wavelength of the terahertz radiation is between 30 µm and 3000 µm.

8. An apparatus according to claim 1, wherein the characteristic dimension of the split-ring resonator is between 5 µm and 500 µm.

9. An apparatus according to claim 1, wherein the radiation absorption pad has formed thereon a plurality of split-ring resonators.

10. A method of imaging an object, the method comprising:
    illuminating the object with terahertz radiation having a wavelength; and
    absorbing, in a detector, a portion of the terahertz radiation that has interacted with the object, the detector comprising a plurality of pixels that move when heated, each pixel having formed thereon a split-ring resonator, at least one of the split-ring resonators having a characteristic dimension that is less than the wavelength of the terahertz radiation and an electrical resonance frequency that corresponds to the wavelength of the terahertz radiation;
    wherein absorption of the portion of radiation causes the at least one split-ring resonator to generate sufficient heat to cause movement of the pixel on which it is formed.

11. A method according to claim 10, wherein the wavelength of the terahertz radiation is between 30 µm and 3000 µm.

12. A method according to claim 10, wherein the characteristic dimension of the split-ring resonator is between 5 µm and 500 µm.

13. A method according to claim 10, wherein the detector further comprises a fixed substrate, and wherein each pixel in the plurality of pixels is attached to the substrate by a cantilever that flexes when heated.

14. A method according to claim 13, wherein each cantilever comprises (a) a plurality of actuation legs formed from two materials having substantially different coefficients of thermal expansion, and (b) a plurality of thermal isolation legs having substantially lower thermal conductivity than the actuation legs.

15. A method according to claim 10, wherein a given pixel has formed thereon a plurality of split-ring resonators, and absorption of the portion of radiation causes the plurality of split-ring resonators to generate sufficient heat to cause movement of the given pixel.

16. A method according to claim 10, further comprising:
- illuminating the detector pixels with a secondary light source; and
- measuring light, from the secondary light source, that is reflected from the surface of a pixel to determine a relative deflection of the pixel.

17. A method according to claim 16, wherein the secondary light source is a laser.

18. A method according to claim 10, wherein each pixel absorbs a different portion of the terahertz radiation that interacted with the object, thereby causing non-uniform deflection of the pixels.

19. A method according to claim 18, further comprising producing a raster image having pixel data, each pixel datum being a function of the relative deflection of a corresponding detector pixel.

\* \* \* \* \*